United States Patent
Noguchi et al.

(10) Patent No.: US 9,818,639 B2
(45) Date of Patent: Nov. 14, 2017

(54) SEMICONDUCTOR DEVICE AND MANUFACTURING METHOD THEREOF

(71) Applicant: Renesas Electronics Corporation, Tokyo (JP)

(72) Inventors: Junji Noguchi, Palo Alto, CA (US); Takayuki Oshima, Ome (JP); Noriko Miura, Itami (JP); Kensuke Ishikawa, Ome (JP); Tomio Iwasaki, Tsukuba (JP); Kiyomi Katsuyama, Iruma (JP); Tatsuyuki Saito, Ome (JP); Tsuyoshi Tamaru, Hachioji (JP); Hizuru Yamaguchi, Akisima (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/469,730

(22) Filed: Mar. 27, 2017

(65) Prior Publication Data
US 2017/0200637 A1    Jul. 13, 2017

Related U.S. Application Data

(60) Continuation of application No. 15/272,553, filed on Sep. 22, 2016, now Pat. No. 9,659,867, which is a (Continued)

(30) Foreign Application Priority Data
Mar. 25, 2003    (JP) .................................. 2003-083348

(51) Int. Cl.
*H01L 21/4763*    (2006.01)
*H01L 21/768*    (2006.01)
(Continued)

(52) U.S. Cl.
CPC .. *H01L 21/76811* (2013.01); *H01L 21/76813* (2013.01); *H01L 21/76832* (2013.01);
(Continued)

(58) Field of Classification Search
CPC ............... H01L 23/528; H01L 23/5226; H01L 23/53228; H01L 23/53295;
(Continued)

(56) References Cited

U.S. PATENT DOCUMENTS 6,255,217 B1    7/2001    Agnello et al.
6,340,435 B1    1/2002    Bjorkman et al.
(Continued)

FOREIGN PATENT DOCUMENTS

JP    2000-200832    7/2000
JP    2000-349150    12/2000
(Continued)

OTHER PUBLICATIONS

Chiang et al., "TDDB Reliability Improvement in Cu Damascene by using a Bilayer-Structured PECVC SiC Dielectric Barrier", IEEE 2002 International Interconnect Technology Conference, Jun. 3-5, 2002, pp. 200-202.
(Continued)

*Primary Examiner* — Matthew E Warren
(74) *Attorney, Agent, or Firm* — Shapiro, Gabor & Rosenberger, PLLC

(57)    ABSTRACT

The reliability of wirings, each of which includes a main conductive film containing copper as a primary component, is improved. On an insulating film including the upper surface of a wiring serving as a lower layer wiring, an insulating film formed of a silicon carbonitride film having excellent barrier properties to copper is formed; on the insulating film, an insulating film formed of a silicon carbide film having excellent adhesiveness to a low dielectric con-
(Continued)

stant material film is formed; on the insulating film, an insulating film formed of a low dielectric constant material as an interlayer insulating film is formed; and thereafter a wiring as an upper layer wiring is formed.

4 Claims, 31 Drawing Sheets

Related U.S. Application Data continuation of application No. 14/702,507, filed on May 1, 2015, now Pat. No. 9,490,213, which is a continuation of application No. 14/320,049, filed on Jun. 30, 2014, now Pat. No. 9,064,870, which is a continuation of application No. 14/095,817, filed on Dec. 3, 2013, now Pat. No. 8,810,034, which is a continuation of application No. 13/862,268, filed on Apr. 12, 2013, now Pat. No. 8,617,981, which is a continuation of application No. 13/243,882, filed on Sep. 23, 2011, now Pat. No. 8,431,480, which is a division of application No. 12/489,006, filed on Jun. 22, 2009, now Pat. No. 8,053,893, which is a division of application No. 11/449,814, filed on Jun. 9, 2006, now Pat. No. 7,777,343, which is a continuation of application No. 10/807,222, filed on Mar. 24, 2004, now Pat. No. 7,323,781.

(51) Int. Cl.
  *H01L 23/528* (2006.01)
  *H01L 23/522* (2006.01)
  *H01L 23/532* (2006.01)

(52) U.S. Cl.
  CPC .. *H01L 21/76834* (2013.01); *H01L 21/76846* (2013.01); *H01L 21/76849* (2013.01); *H01L 21/76883* (2013.01); *H01L 23/528* (2013.01); *H01L 23/5226* (2013.01); *H01L 23/53228* (2013.01); *H01L 23/53238* (2013.01); *H01L 23/53295* (2013.01)

(58) Field of Classification Search
  CPC ......... H01L 21/76811; H01L 21/76813; H01L 20/76829; H01L 21/76832
  USPC ........ 257/758, 760, 762, 767; 438/622, 624, 438/687
  See application file for complete search history.

(56) References Cited

U.S. PATENT DOCUMENTS

| | | | |
|---|---|---|---|
| 6,348,725 B2 | 2/2002 | Cheung et al. | |
| 6,479,408 B2 | 11/2002 | Shioya et al. | |
| 6,514,852 B2 | 2/2003 | Usami | |
| 6,541,282 B1 | 4/2003 | Cheung et al. | |
| 6,555,464 B2 | 4/2003 | Fukada et al. | |
| 6,562,690 B1 | 5/2003 | Cheung et al. | |
| 6,670,710 B2 | 12/2003 | Matsunaga | |
| 6,689,690 B2 | 2/2004 | Ikeda | |
| 6,828,229 B2 | 12/2004 | Lee et al. | |
| 6,974,766 B1* | 12/2005 | Huang | C23C 16/325 257/E21.029 |
| 9,064,870 B2 | 6/2015 | Noguchi et al. | |
| 2001/0030367 A1 | 10/2001 | Noguchi et al. | |
| 2001/0045651 A1 | 11/2001 | Saito et al. | |
| 2001/0054765 A1 | 12/2001 | Ohto et al. | |
| 2002/0042193 A1 | 4/2002 | Noguchi et al. | |
| 2002/0081839 A1* | 6/2002 | Shimooka | H01L 23/5226 438/643 |
| 2002/0100984 A1 | 8/2002 | Oshima et al. | |
| 2002/0127843 A1 | 9/2002 | Noguchi et al. | |
| 2002/0168849 A1 | 11/2002 | Lee et al. | |
| 2002/0172766 A1 | 11/2002 | Laxman | |
| 2002/0192945 A1 | 12/2002 | Nagahara | |
| 2003/0003765 A1 | 1/2003 | Gibson et al. | |
| 2003/0008493 A1 | 1/2003 | Lee | |
| 2003/0030146 A1 | 2/2003 | Tamaru et al. | |
| 2003/0087513 A1 | 5/2003 | Noguchi et al. | |
| 2003/0155657 A1* | 8/2003 | Tonegawa | H01L 21/32051 257/774 |
| 2003/0173671 A1 | 9/2003 | Hironaga et al. | |
| 2003/0183939 A1 | 10/2003 | Kakamu et al. | |
| 2003/0183940 A1 | 10/2003 | Noguchi et al. | |
| 2004/0048467 A1 | 3/2004 | Marsh | |
| 2004/0048468 A1* | 3/2004 | Liu | H01L 21/76805 438/687 |
| 2004/0067658 A1 | 4/2004 | Ko et al. | |
| 2004/0161535 A1 | 8/2004 | Goundar et al. | |
| 2010/0210107 A1 | 8/2010 | Ohmori et al. | |

FOREIGN PATENT DOCUMENTS

| | | |
|---|---|---|
| JP | 2001-53076 | 2/2001 |
| JP | 2001-110789 | 4/2001 |
| JP | 2001-291720 | 10/2001 |
| JP | 2001-319928 | 11/2001 |
| JP | 2001-326279 | 11/2001 |
| JP | 2002-9150 | 1/2002 |
| JP | 2002-43419 | 2/2002 |
| JP | 2002-503879 | 2/2002 |
| JP | 2002-110679 | 4/2002 |
| JP | 2002-134494 | 5/2002 |
| JP | 2002-164428 | 6/2002 |
| JP | 2002-170882 | 6/2002 |
| JP | 2002-203899 | 7/2002 |
| JP | 2002-270691 | 9/2002 |
| JP | 2002-324837 | 11/2002 |
| JP | 2002-353310 | 12/2002 |
| JP | 2002-373936 | 12/2002 |
| JP | 2003-059923 | 2/2003 |
| JP | 2003-60030 | 2/2003 |
| JP | 2003-142579 | 5/2003 |
| JP | 2003-142593 | 5/2003 |
| JP | 2003-152076 | 5/2003 |
| JP | 2003-297918 | 10/2003 |
| JP | 2004-128050 | 4/2004 |

OTHER PUBLICATIONS

Higashi et al., "A Manufacturable Copper/Low-k SiOC/SiCN Process Technology for 90nm-node High Performance eDRAM", Proceedings of the 2002 IEEE International Interconnect Technology Conference, pp. 15-17.

* cited by examiner

SEMICONDUCTOR DEVICE AND MANUFACTURING METHOD THEREOF

CROSS REFERENCES TO RELATED APPLICATION

The present application claims priority from Japanese patent application JP 2003-083348 filed on Mar. 25, 2003, the contents of which is hereby incorporated by reference into this application.

BACKGROUND OF THE INVENTION

The present invention relates to a semiconductor device and a technique for manufacturing it and, particularly, to a technique effectively applied to a semiconductor device having wirings each including a main conductive film containing copper as a primary component.

Elements of the semiconductor device are connected by, for example, a multilayer wiring structure, whereby circuit is configured. Along with an ultra-fine structure, an embedded wiring structure has been developed as a wiring one. The embedded wiring structure is formed by, for example, embedding, by use of a Damascene technique (Single-Damascene technique and Dual-Damascene technique), wiring materials in wiring openings such as wiring grooves and holes formed in an insulating film.

Japanese patent Laid-open No. 2002-43419 discloses a technique in which a 50 nm thick P—SiC film as a Cu atom diffusion preventing layer is formed on a Cu layer as an underlying wiring, and a low dielectric constant layer as an interlayer insulating film is formed on the P—SiC film.

Japanese Patent Laid-open No. 2002-270691 discloses a technique in which, after a copper wiring is formed, a 5 to 50 nm thick insulating barrier film made of silica carbide (SiC), silica nitride (SiN) and a mixture (SiCN) thereof, etc. is formed on a plane formed by a CMP method.

Also in Non-patent Document 1, there is described a technique for using, as a barrier dielectric, a two-layer dielectric comprising a lower α-SiC film and a upper α-SiCN film.

[Non-patent Document 1]: C. C. Chiang, M. C. Chen, Z. C. Wu, L. J. Li, S. M. Jang, C. H. Yu, M. S. Liang, TDDB Reliability Improvement in Cu Damascene by using a Bilayer-Structured PECVD SiC Dielectric Barrier, "2002 IITC (International Interconnect Technology Conference)", (U.S.A.) IEEE, 2002, pp. 200-202

SUMMARY OF THE INVENTION

Examinations by the present inventors have found that if a semiconductor device having an embedded copper wiring is left to stand at the high temperature, the electric resistance of the embedded copper wiring is increased by stress migration. This degrades the reliability of the embedded copper wiring.

In the semiconductor device having the embedded copper wiring, it is also required to improve TDDB (Time Dependence on Dielectric Breakdown) life of the embedded copper wiring. According to the examinations by the present inventors, it has been found out by TDDB life tests that copper ions in the wiring are drifted by an electric field exerted between adjacent wirings in the embedded copper wirings disposed on the same layer, whereby dielectric breakdown is caused.

Accordingly, in the embedded copper wiring, there is a demand for further improvement of the reliability, for example, the improvement of stress migration characteristics and/or the enhancement of TDDB life.

An object of the present invention is to provide a semiconductor device and a manufacturing method thereof, which are capable of improving the reliability of the wirings each including a main conductive film containing copper as a primary component.

The above and other objects and novel features will be apparent from the description of this specification and the accompanying drawings.

A semiconductor device according to the present invention is one obtained by using a laminated film of: a first barrier insulating film formed, as a barrier insulating film of an embedded copper wiring, on an insulating film in which a copper wiring is embedded, and having excellent barrier properties to copper; and a second barrier insulating film formed on the first barrier insulating film and having excellent adhesiveness to a low dielectric constant material film.

Also, a semiconductor device according to the present invention is one obtained by using a laminated film of: a first barrier insulating film, as a barrier insulating film of an embedded copper wiring, on an insulating film in which a copper wiring is embedded, and made of a material containing silicon and carbon and at least one of nitrogen and oxygen; and a second barrier insulating film formed on the first barrier insulating film and made of silicon carbide.

Further, a semiconductor device according to the present invention is one in which, in a barrier insulating film of an embedded copper wiring, a concentration of nitrogen in a barrier insulating film near the interface between a wiring and the barrier insulating film is higher than that of the barrier insulating film near the interface between a low dielectric constant material film disposed on the barrier insulating film and the barrier insulating film.

Further, a semiconductor device according to the present invention is one in which: an insulating film having a function of restraining or preventing the diffusion of copper is formed on an insulating film in which a copper wiring is embedded; an insulating film having a function of controlling a stress is formed thereon; the stress of a laminated film of the insulating film having a function of restraining or preventing the diffusion of copper and the insulating film having a function of controlling the stress is −180 MPa or more.

Further, a manufacturing method for a semiconductor device according to the present invention comprises the steps of: forming a first barrier insulating film having excellent barrier properties to copper, on an insulating film in which a copper wiring is embedded; forming a second barrier insulating film having excellent adhesiveness to a low dielectric constant material film on the first barrier insulating film; and forming a low dielectric constant material film on the second barrier insulating film.

Further, a manufacturing method for a semiconductor device according to the present invention comprises the steps of: forming a first barrier insulating film made of a material containing silicon and carbon and at least one of nitrogen and oxygen, on an insulating film in which a copper wiring is embedded; forming a second barrier insulating film made of silicon carbide, on the first barrier insulating film; and forming a low dielectric constant material film on the second barrier insulating film.

Further, a manufacturing method for a semiconductor device according to the present invention comprises the step of: forming a barrier insulating film, on an insulating film in which a copper wiring is embedded; and forming a low dielectric constant material film on the barrier insulating film, wherein a concentration of nitrogen in the barrier insulating film near the interface between a wiring and the barrier insulating film is higher than that of the barrier insulating film near the interface between a low dielectric constant material film disposed on the barrier insulating film and the barrier insulating film.

DESCRIPTION OF THE PREFERRED EMBODIMENTS

Hereinafter, embodiments of the present invention will be described in detail based on the drawings. Note that, through all the drawings for describing the embodiments, members having the same function are denoted by the same reference symbol and the repetitive description thereof will be omitted. Further, in the below-mentioned embodiments, the description of an identical or similar section(s) will not be repeated in principle unless required especially.

First Embodiment

Figure 1:
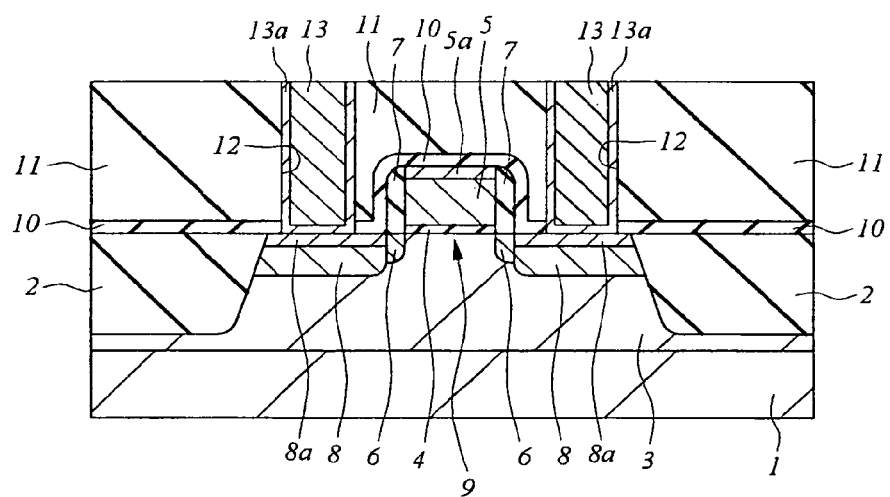
FIG. 1 is a sectional view showing the principal portion of a semiconductor device in a manufacturing process according to an embodiment of the present invention.

A semiconductor device and a manufacturing process thereof according to a first embodiment of the present invention will be explained in reference to the drawings. FIG. 1 is a sectional view of the principal portion of the semiconductor device, for example, a MISFET (Metal Insulator Semiconductor Field Effect Transistor) in the manufacturing process according to the first embodiment of the present invention.

As shown in FIG. 1, for example, on a main surface of a semiconductor substrate (semiconductor wafer) 1 made of a p-type single crystal silicon and the like and having a specific resistance of approximately 1 to 10 Ωcm, an device isolation region 2 is formed. The device isolation region 2 is made of silicon oxide or the like and is formed by, for example, a STI (shallow Trench Isolation) or LOCOS (Local Oxidization of Silicon) method or the like.

Next, a p-type well 3 is formed in an area for forming an n-channel type MISFET on the semiconductor substrate 1. The p-type well 3 is formed by an iron-implantation of impurities, for example, boron (B) and the like.

Then, a gate insulating film 4 is formed on a surface of the p-type well 3. The gate insulating film 4 is formed of, for example, a thin silicon oxide film or the like and is formed by, for example, a heat oxidization method or the like.

Next, a gate electrode 5 is formed on the gate insulating film 4 of the p-type well 3. For example, a poly crystal silicon film is formed over the semiconductor substrate 1, and phosphorous (P) or the like is ion-implanted into the poly crystal silicon film to make a low resistance n-type semiconductor film, and the poly crystal silicon film is dry etched and patterned, whereby the gate electrode 5 formed of the poly crystal silicon film can be formed.

Next, impurities such as phosphorous are ion-implanted into areas disposed on both sides of the gate electrode 5 of the p-type well 3, and thereby an n-type semiconductor region 6 is formed.

Next, on a side wall of the gate electrode 5, a sidewall spacer or sidewall 7 made of, for example, silicon oxide or so is formed. The sidewall 7 is formed by, for example, depositing a silicon oxide film over the semiconductor substrate 1 and anisotropically etching this silicon oxide film.

After the sidewall 7 is formed, an $n^+$ type semiconductor region 8 (source and drain) is formed by, for example, ion-implanting impurities such as phosphorous into the areas disposed on both sides of the gate electrode 5 and the sidewall 7 of the p-type well 3. The impurity concentration of the $n^+$ type semiconductor region 8 is higher than that of the $n^-$ type semiconductor region 6.

Next, by exposing the surfaces of the gate electrode 5 and the $n^+$ type semiconductor region 8 and, for example, depositing a cobalt (Co) film thereon to perform a thermal treatment, silicide films 5a and 8a are formed on the surfaces of the gate electrode 5 and the $n^+$ type semiconductor region 8, respectively. Thereby, a diffusion resistance and a contact resistance of the n+ type semiconductor region 8 can be made low. Thereafter, the non-reactive cobalt film is removed.

In this manner, an n-channel type MISFET (Metal Insulator Semiconductor Field Effect Transistor) 9 is formed on the p-type well 3.

Next, an insulating film 10 made of silicon nitride or the like, and an insulating film 11 made of silicon oxide or the like are laminated in this order onto the semiconductor substrate 1. Then, the insulating films 11 and 10 are dry etched sequentially, whereby contact holes 12 are formed over tops or the like of the n+ type semiconductor region (source and drain) 8. At each bottom of the contact holes 12, part of the main surface of the semiconductor substrate 1, for example, part of the $n^+$ type semiconductor region 8 and part of the gate electrode 5, etc. is exposed.

Next, in the contact holes 12, plugs 13 each made of tungsten (W) or the like are formed. For example, the plugs 13 may be formed by: forming a titanium nitride film 13a as a barrier film on the insulating film 11 and inside the contact holes 12; thereafter forming a tungsten film on the titanium nitride film 13a by a CVD (Chemical Vapor Deposition) method or the like to fill the contact holes 12; and removing the unnecessary tungsten film and titanium nitride film 13a disposed on the insulating film 11 by a CMP (Chemical Mechanical Polishing) method or etch back method or the like.

FIGS. 2 to 13 each show a sectional view of the principal portion of the semiconductor device in the manufacturing process following FIG. 1. Note that, for an easy understanding, the portions corresponding to the structure illustrated below the insulating film 11 in FIG. 1 will be omitted in FIGS. 2 to 13.

Figure 2:
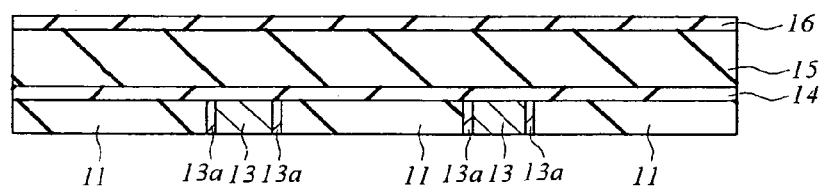
FIG. 2 is a sectional view showing the principal portion of the semiconductor device in the manufacturing process following FIG. 1.

As shown in FIG. 2, an insulating film (etching stopper film) 14 is formed on the insulating film 11 in which the plugs 13 are embedded. The insulating film 14 consists of, for example, a silicon carbide (SiC) film. As another material of the insulating film 14, a silicon nitride ($Si_xN_y$) film or the like may be used. The insulating film 14 may be structured by a laminated film of a silicon carbide (SiC) film and a silicon nitride ($Si_xN_y$) film. The insulating film 14 is formed for preventing damage to the lower layer thereof and deterioration of dimensional precision for the processing, which are caused due to too much removal in forming grooves or holes for wiring formation on an upper insulating film (interlayer insulating film) 15 thereof by the etching. Namely, the insulating film 14 can function as an etching stopper in etching the insulating film (interlayer insulating film) 15.

Next, the insulating film (interlayer insulating film) 15 is formed on the insulating film 14. It is preferred that the insulating film 15 is made of a low dielectric constant material (so-called Low-K insulating film, Low-K material) such as organic polymer or organic silica glass. Note that the low dielectric constant insulating film (Low-K insulating film) means an insulating one having a lower dielectric constant than that of a silicon dioxide film included in a passivation film (for example, TEOS (Tetraethoxysilane) oxide film) by way of an example. Generally, the TEOS oxide film whose specific dielectric constant ∈ is approximately 4.1 to 4.2 and a film whose dielectric constant is less than 4.1 to 4.2 is called a low dielectric constant insulating film.

The organic polymer as the above-mentioned low dielectric constant material includes, for example, SILK (manufactured by Dow Chemical Co., USA, specific dielectric constant=2.7, heat resistance temperature=490° C. or higher, dielectric breakdown resistance=4.0 to 5.0 MV/Vm), or FLARE of a poly allyl ether (PAE) system material (manufactured by Honeywell Electronic Materials, specific dielectric constant=2.8, heat resistance temperature 400° C. or higher). This PAE system material has the advantages of high basic performance, of excellent mechanical strength and thermal stability and low costs. The organic silica glass (SiOC system material) as the above-mentioned low dielectric constant material includes, for example, HSG-R7 (manufactured by Hitachi Chemicals Co., Ltd., specific dielectric constant=2.8, heat resistance temperature=650° C.), Black Diamond (manufactured by Applied Materials, Inc., USA, specific dielectric constant=3.0 to 2.4, heat resistance temperature=450° C.), or p-MTES (manufactured by Hitachi, specific dielectric constant=3.2). The other SiOC system material includes, for example, CORAL (manufactured by Novellus Systems, Inc., USA, specific dielectric constant=2.7 to 2.4, heat resistance temperature=500° C.), and Aurora 2.7 (manufactured by Nihon ASM Co., Ltd., specific dielectric constant=2.7, heat resistance temperature=450° C.).

For example, FSG (SiOF system materials); HSQ (hydrogen silsesquioxane) system materials; MSQ (methyl silsesquioxane) system material, porous HSQ system material, porous MSQ material; or porous organic system materials may be used as the above-mentioned low dielectric constant material. The above-mentioned HSQ system material includes, for example, OCD T-12 (manufactured by Tokyo Applied Industry, specific dielectric constant=3.4 to 2.9, heat resistance temperature=450° C.); FOx (manufactured by Dow Corning Corp., USA, specific dielectric constant=2.9); OCL T-32 (manufactured by Tokyo Applied Industry, specific dielectric constant=2.5, heat resistance temperature=450° C.) or the like. The above-mentioned MSQ system material includes, for example, OCD T-9 (manufactured by Tokyo Applied Industry, specific dielectric constant=2.7, heat resistance temperature=600° C.); LKD-T200 (manufactured by JSR, specific dielectric constant=2.7 to 2.5, heat resistance temperature=450° C.); HOSP (manufactured by Honeywell Electronic Materials, USA, specific dielectric constant=2.5, heat resistance temperature=550° C.); HSG-RZ25 (manufactured by Hitachi Chemicals, Co., Ltd., specific dielectric constant=2.5, heat resistance temperature=650° C.); OCL T-31 (manufactured by Tokyo Applied Industry, specific dielectric constant=2.3, heat resistance temperature=500° C.); LKD-T400 (manufactured by JSR, specific dielectric constant=2.2 to 2, heat resistance temperature=450° C.); or the like. The above-mentioned porous HSQ system material includes, for example, XLK (manufactured by Dow Corning Corp., USA, specific dielectric constant=2.5 to 2); OCL T-72 (manufactured by Tokyo Applied Industry, specific dielectric constant=2.2 to 1.9, heat resistance temperature=450° C.); Nanoglass (manufactured by Honeywell Electronic Materials, USA, specific dielectric constant=2.2 to 1.8, heat resistance temperature=500° C. or higher); or MesoELK (manufactured by Air Products and Chemicals, Inc., USA, specific dielectric constant=2 or less). The above-mentioned porous MSQ system material includes, for example, HSG-6211X (manufactured by Mitachi Chemicals, Co., Ltd., specific dielectric constant=2.4, heat resistance temperature=650° C.); ALCAP-S (manufactured by Asahi Chemicals, Co., Ltd., specific dielectric constant=2.3 to 1.8, heat resistance temperature=450° C.); OCL T-77 (manufactured by Tokyo Applied Industry, specific dielectric constant=2.2 to 1.9, heat resistance temperature=600° C.); HSG-6210X (manufactured by Hitachi Chemicals, Co., Ltd., specific dielectric constant=2.1, heat resistance temperature=650° C.); silica aero gel (manufactured by Kobe Steels, specific dielectric constant=1.4 to 1.1) or the like. The above-mentioned porous organic system material includes, for example, PolyELK (manufactured by Air Products and Chemicals, Inc., USA, specific dielectric constant=2 or less, heat resistance temperature=490° C.) or the like. The above-referenced SiOC system material and SiOF system material are formed by, for example, the CVD method. For example, the above-described Black Diamond is formed by the CVD method using a mixture gas of trimethylsilane and oxygen, or the like. Further, the above-mentioned p-MTES is formed by, for example, the CVD method using a mixture gas of methyltrietxysilane and $N_2O$, or the like. Low dielectric constant insulating materials except the above-mentioned ones are formed by, for example, a coating method.

On the insulating film 15 made of such Low-K materials, an insulating film 16 is formed by, for example, the CVD method or the like. The insulating film 16 consists of, for example, a silicon oxide ($SiO_x$) film represented by silicon dioxide ($SiO_2$). As another material of the insulating film 16, a silicon oxynitride (SiON) film may also be used. Additionally, the insulating film 16 can have functions of securing the mechanical strength, protecting the surface, and securing humidity resistance, etc. of the insulating film 15 in, for example, processing the CMP. Further, when the insulating film 15 consists of a silicon oxide (SiOF) film containing fluoride (F), the insulating film 16 may function to prevent the diffusion of fluoride in the insulating film 15. Furthermore, if the insulating film 15 has resistance properties in, for example, the CMP processing, the formation of the insulating film 16 may be omitted.

Figure 3:
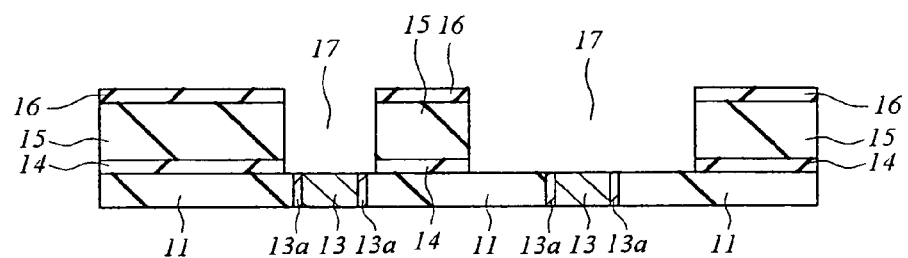
FIG. 3 is a sectional view showing the principal portion of the semiconductor device in the manufacturing process following FIG. 2.

Next, as shown in FIG. 3, by use of a photolithography method and a dry etching method, the insulating films 16, 15, and 14 are selectively removed to form openings (wiring openings and wiring grooves) 17. At this time, on the bottom of the opening 17, an upper surface of the plug 13 is exposed. Then, a not shown photoresist pattern used as an etching mask (and a reflection prevention film) is removed by ashing or the like. If the insulating film 15 is made of a material to be damaged by oxygen plasma, such as an organic polymer system material (for example, the above-mentioned SiLK) and a porous organic system material (for example, the above-mentioned PolyELK), then the photoresist pattern (and the reflection prevention film) may be removed by the ashing while the insulating film 15 is etched by a reducing plasma treatment such as a $NH_3$ or $N_2/H_2$ plasma treatment.

Figure 4:
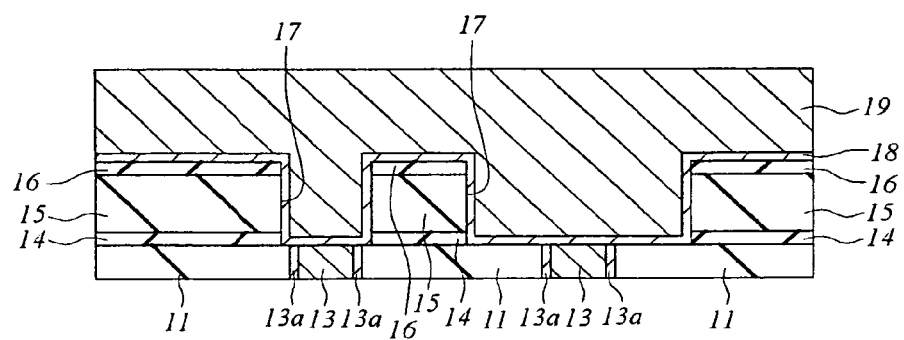
FIG. 4 is a sectional view showing the principal portion of the semiconductor device in the manufacturing process following FIG. 3.

Next, as shown in FIG. 4, a relatively thin conductive barrier film 18, for example, having a thickness of approximately 50 nm and made, of titanium nitride (TiN) or the like, is formed on the entirety of the main surface of the semiconductor substrate 1 (namely, on the insulating film 16 including the bottoms and side walls of the openings 17). The conductive barrier film 18 can be formed by the use of, for example, a spattering or CVD method or the like. The conductive barrier film 18 has a function of restraining or preventing the diffusion of copper for forming a main conductive film to be mentioned later and a function of improving the wettability of copper at the time of reflow of the main conductive film. As the material of such a conductive barrier film 18, refractory metal nitride such as tungsten nitride (WN) hardly reacting with copper or tantalum nitride (TaN) may be used instead of titanium nitride. Further, as the material of the conductive barrier film 18, a material obtained by adding silicon (Si) to refractory metal nitride, and a refractory metal such as tantalum (Ta), titanium (Ti), tungsten (W), and a titanium tungsten (TiW) alloy which hardly react with copper may be used. Additionally, the conductive barrier film 18 may be formed by the use of not only a single film made of the above-mentioned material but also a laminated film.

Next, on the conductive barrier film 18, a main conductive film 19, for example, having a thickness of approximately 800 to 1600 nm and made of relatively thick copper, is formed. The main conductive film 19 may be formed by use of, for example, a CVD, spattering or plating method. Also, the main conductive film 19 may be formed by a conductive film containing copper as a primary component, for example, copper or a copper alloy (containing Cu as a primary component and containing, for example, Mg, Ag, Pd, Ti, Ta, Al, Nb, Zr or Zn, etc.). Furthermore, a seed film made of relatively thin copper (or a copper alloy) is formed on the conductive barrier film 18 by the spattering method or the like, and thereafter the main conductive film 19 made of relatively thick copper (or copper alloy) or the like may be formed on the seed film by the spattering method or the like. Then, a heat treatment is performed to the semiconductor substrate 1 in a non-oxidation atmosphere (for example, hydrogen atmosphere) at, for example, approximately 475° C., and thereby the reflow of the main conductive film 19 is carried out and the insides of the openings 17 are filled with copper without gaps therebetween.

Figure 5:
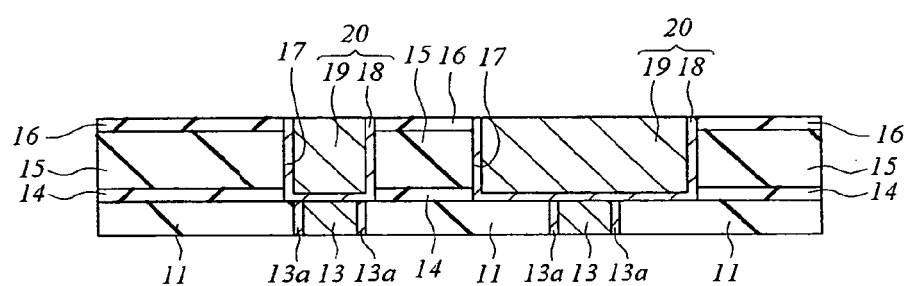
FIG. 5 is a sectional view showing the principal portion of the semiconductor device in the manufacturing process following FIG. 4.

Next, as shown in FIG. 5, the main conductive film 19 and the conductive barrier film 18 are polished by, for example, the CMP method until the upper surface of the insulating film 16 is exposed. The unnecessary conductive barrier film 18 and main conductive film 19 on the insulating film 16 are removed, and the conductive barrier film 18 and the main conductive film 19 are left in the opening 17 serving as a wiring opening, whereby, as shown in FIG. 5, a wiring (first layer wirings) 20 consisting of the relatively thin conductive barrier film 18 and the relatively thick main conductive film 19 is formed in the opening 17. The formed wirings 20 are electrically connected through the plugs 13 to the $n^+$ type semiconductor region (source and drain) 8 and the gate electrode 5. Or, by the etching (electrolysis etching or the like), the unnecessary conductive barrier film 18 and main conductive film 19 may be removed.

Next, the semiconductor substrate 1 is put in a processing room of a plasma CVD apparatus and an ammonia gas is introduced to apply plasma power source thereto, and thereafter an ammonia ($NH_3$) plasma treatment is performed to the semiconductor substrate 1 (especially, a CMP surface where the wirings 20 are exposed). Or, $N_2$ gas and $H_2$ gas are introduced and a $N_2/H_2$ plasma treatment is performed. By such a reducing plasma treatment, copper oxide (CuO, $Cu_2O$, $CuO_2$) in the surface of the copper wiring oxidized by the CMP is reduced to copper (Cu), and further a copper nitride (CuN) layer is formed on the surface (extremely thin area) of the wiring 20.

Figure 6:
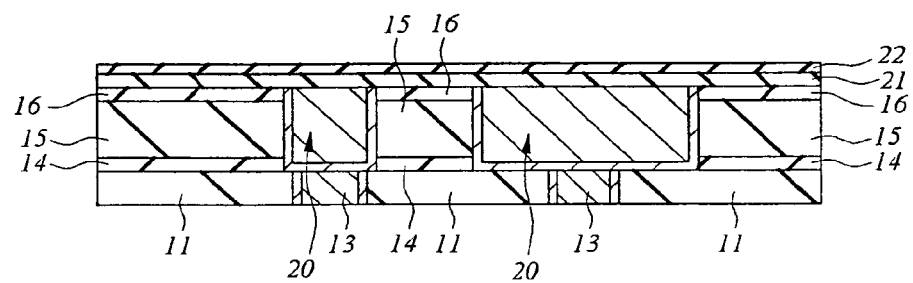
FIG. 6 is a sectional view showing the principal portion of the semiconductor device in the manufacturing process following FIG. 5.

Then, after cleaning is performed as occasion demands, as shown in FIG. 6, an insulating film 21 and an insulating film 22 are formed in this order by, for example, a plasma CVD method or the like, over the entirety of the main surface of the semiconductor substrate 1, respectively. Namely, the insulating films 21 and 22 are formed in this order on the insulating film 16 including the upper surfaces of the wirings 20.

The insulating film 21 functions as a barrier insulating film for copper wiring. Therefore, the insulating film 21 restrains or prevents copper in the main conductive film 19 of the wiring 20 from diffusing in an insulating film (interlayer insulating film) 23 to be formed later. The insulating film 21 is preferably formed of a material film having excellent barrier properties to copper (having a high function of restraining or preventing copper from diffusing), for example, of a silicon carbonitride (SiCN) film. The silicon carbonitride (SiCN) film as the insulating film 21 can be formed by, for example, the plasma CVD method using a trimethylsilane gas and an ammonia gas. The silicon carbonitride (SiCN) film has excellent barrier properties to copper and has a low leak current and good breakdown property accordingly. Therefore, it is possible to securely prevent the diffusion of copper in the main conductive film 19 of the wiring 20.

Figure 7:
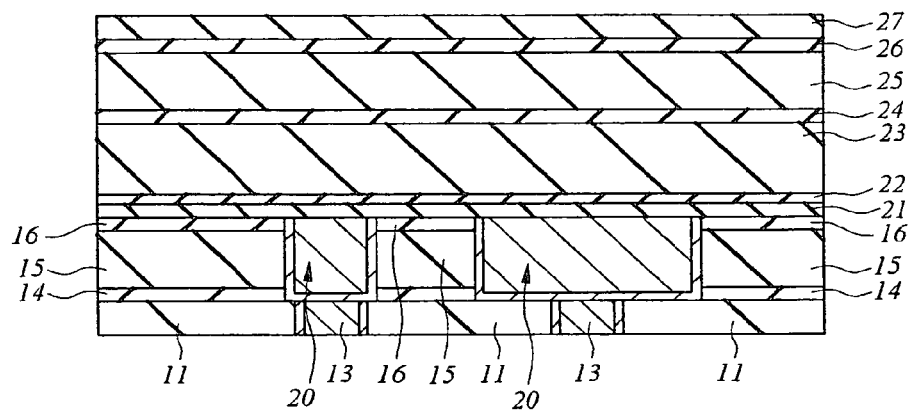
FIG. 7 is a sectional view showing the principal portion of the semiconductor device in the manufacturing process following FIG. 6.

In the present embodiment, the insulating film 22 is formed on the insulating film 21. As shown in FIG. 7, the insulating film 22 is preferably formed of a material film having excellent adhesiveness to an insulating film (low dielectric constant material film) 23 to be formed on the insulating film 22, for example, of a silicon carbide (SiC) film. That is, the insulating film 22 functions as an adhesive layer. The silicon carbide (SiC) film as the insulating film 22 can be formed by, for example, the plasma CVD method using a trimethylsilane gas. For this reason, since the insulating films 21 and 22 can be formed by changing, from one to the other of them, a stream of a film-forming gas in the same plasma CVD film-forming apparatus, the steps of manufacturing process can be reduced. The insulating film 22 (SiC) also has barrier properties to copper (Cu), but is smaller in the effects of the barrier properties than the insulating film 21 (SiCN). Namely, in the present embodiment, the insulating film 21 is larger in the barrier properties to copper than the insulating film 22. Further, the adhesiveness (adhesion properties) between the insulating film 22 and the insulating film (low dielectric constant material film) 23 is larger than that between the insulating films 21 and 23 at the time when the insulating film 23 is formed on the insulating film 21.

Hereinafter, in the present embodiment, these insulating films 21 and 22 may be referred to as first and second barrier insulating films for convenience in some cases.

If the insulating film 22 is formed of a silicon carbide (SiC) film not containing nitrogen and carbon, it is possible to improve the adhesiveness (adhesion properties) between the insulating film 22 and the below-mentioned insulating film 23. Further, because the insulating film 22 also has barrier properties to copper (function of restraining or preventing copper from diffusing), it is possible to securely prevent, by forming the insulating film 22 on the insulating film 21, copper in the main conductive film 19 of the wiring 20 from diffusing. Additionally, of the insulating films 21 and 22, if the insulating film 21 contacting to the wiring 20 is formed by a material film having excellent barrier properties to copper (for example, by a silicon carbonitride (SiCN) film) and if the insulation film 22 is formed between the insulating films 21 and 23 by a material film having excellent adhesiveness (adhesion properties) to the insulating film 23 serving as an interlayer insulating film (for example, by a silicon carbide (SiC) film) even when the material film has slightly lower barrier properties to cupper than those of the insulating film 21, then it is possible to securely prevent copper in the main conductive film 19 of the wiring 20 from diffusing and to more properly improve the adhesiveness between the films (insulating films). Therefore, the insulating film 21 (first barrier insulating film) and the insulating film 22 (second barrier insulating film) are laminated to form the insulating film 21 on a side of the wiring 20 and the insulating film 22 on a side of the insulating film 23, so that the reliability of the wirings can be improved.

Further, it is preferred that the thickness of the insulating film 21 as the underlying barrier insulating film (first barrier insulating film) is larger than that of the insulating film 22 as the upper barrier insulating film (second barrier insulating film). The thickness of the insulating film 21 whose barrier properties to copper are relatively large (or whose breakdown property is relatively high) is larger than that of the insulating film 22. Therefore, it is possible to enhance the function of preventing copper in the main conductive film 19 of the wiring 20 from diffusing and further enhance the breakdown property of the entirety of the laminated film consisting of the insulating films 21 and 22. Additionally, the thickness of the insulating film 21 is preferably 40 nm or less, more preferably, for example, approximately 25 to 30 nm. Thereby, it is possible to secure high barrier properties to copper and reduce the capacity between the wirings. Furthermore, the thickness of the insulating film 22 is preferably 10 nm or less, more preferably, for example, approximately 5 to 10 nm. Accordingly, it is possible to secure the adhesiveness between the insulating films 22 and 23 and reduce the capacity between the wirings.

Further, by using, as the insulating film 21, the above-mentioned silicon carbonitride (SiCN) film having excellent barrier properties to copper and good breakdown property, it is possible to more properly prevent diffusion of copper in the main conductive film 19 of the wiring 20 and improve the reliability of the wirings.

Further, as another aspect, as a material of the insulating film 21, a film (SiCON film) in which oxygen is added to silicon carbonitride (SiCN) or a film (SiOC film) in which oxygen (O) is added to silicon carbide (SiC) or the like may be used. For this reason, since the dielectric constant of the insulating film 21 can be made small, the capacity between the wirings can be reduced. Additionally, the leak current between the wirings can be further reduced. Accordingly, as the material of the insulating film 21, a material containing silicon and carbon as well as at least one of nitrogen and oxygen may be used. If a silicon carbonitride (SiCN) film is used as the insulating film 21, it is possible to further enhance the function of preventing the diffusion of copper and improving the breakdown property of the wirings. Meanwhile, if a film (SiCON film) in which oxygen (O) is added to silicon carbonitride (SiCN) or a film (SiOC film) in which oxygen (O) is added to silicon carbide (SiC) are used as the insulation film 21, it is possible to further reduce the capacity between the wirings and also the leakage current.

Next, as shown in FIG. 7, on the insulating film 22, an insulating film (interlayer insulating film) 23, an insulating film (etching stopper film) 24, an insulating film (interlayer insulating film) 25, an insulating film (CMP protective film) 26, and an insulating film (hard mask layer) 27 are formed in this order. The insulating film (interlayer insulating film) 23 may be made of the same material (low dielectric constant material) as that of the above-mentioned insulating film 15, and may be formed by the coating method or CVD method or the like. The insulating film (etching stopper film) 24 may be made of the same material (for example, silicon oxide film) as those of the above-mentioned insulating film 16. The insulating film (interlayer insulating film) 25 may be made of the same material (low dielectric constant materials) as that of the above-descried insulating film 15, and may be formed by the coating method or CVD method or the like. The insulating film (CMP protective film) 26 may be made of the same material (for example, silicon oxide film) as that of the above-mentioned insulating film 16. The insulating film 26 can have functions of, for example, securing the mechanical strength, protecting the surface, and securing the humidity resistance, etc. of the insulating film 25 in the CMP treatment. However, if the insulating film 25 has the endurance for, for example, the CMP treatment, the formation of the insulating film 26 may be omitted. The insulating film (hard mask layer) 27 may be formed of, for example, a silicon nitride film (SiN), a silicon carbide (SiC) film, a silicon carbonitride (SiCN) film, or an aluminum oxide (AlO) film.

The insulating film 23 is made of the above-mentioned low dielectric constant material. However, when the above-described low dielectric constant material film is formed on a material film (corresponding to the insulating film 21) including nitrogen (N) or oxygen (O) such as the material film in which nitrogen (N) or oxygen (O) is added to, for example, silicon carbide (SiC) (for example, SiCN film, SiOC film, or SiCON film), there is a possibility that the adhesiveness (adhesion properties) between the underlying film (material film including nitrogen (N) or oxygen (O)) and the low dielectric constant material film will be reduced. For this reason, there is a possibility that the peeling will be caused between the films and that if the peeling especially occurs near the bottom of a via connecting an upper layer wiring and a lower layer wiring, there is a possibility that the reliability of the wirings will be degraded. Such a phenomenon can be generally caused in the above-mentioned low dielectric constant materials, and the occurrence thereof is especially prominent in the case of using a material containing silicon (Si), oxygen (O), and carbon (C) as the low dielectric constant material, and is more prominent in the case of using, for example, carbonated silicon (organic silicon glass, SiOC system material, for example, above-mentioned Black Diamond and the like), MSQ (methyl silsesquioxane) system material, or HSQ (hydrogen silsesquioxane) system material (including their porous materials) as the low dielectric constant material.

In the present embodiment, since the insulating film 23 made of the low dielectric constant materials is formed on the insulating film 22 made of a silicon carbide (SiC) film not including nitrogen (N) or oxygen (O), the adhesiveness (adhesion properties) between the underlying insulating film 22 and the insulating film 23 made of the low dielectric constant materials can be improved. As a consequence, even when the low dielectric constant materials, especially low dielectric constant materials including silicon (Si), oxygen (O) and carbon (C), are used as the materials of the insulating film 23, it is possible to prevent the insulating film 23 from peeling off the underlying layer (insulating film 22). Therefore, the reliability of the wirings can be improved.

Figure 8:
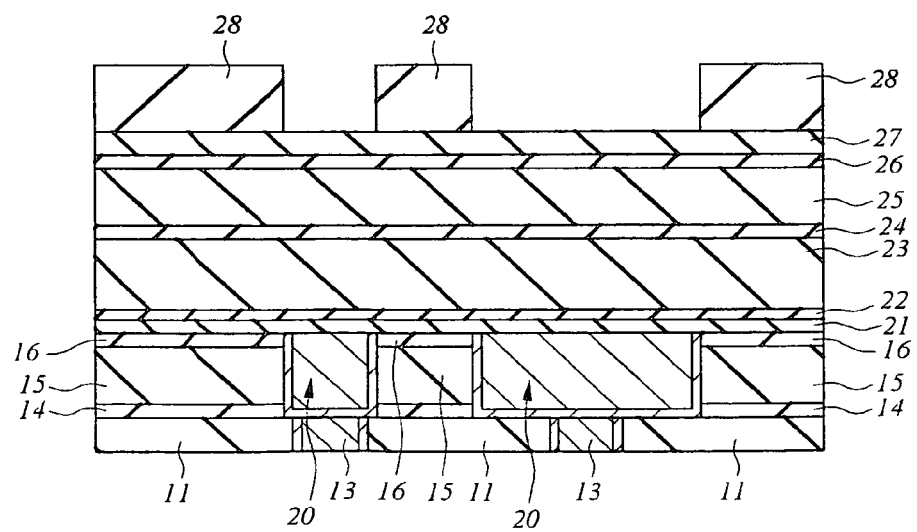
FIG. 8 is a sectional view showing the principal portion of the semiconductor device in the manufacturing process following FIG. 7.
Figure 9:
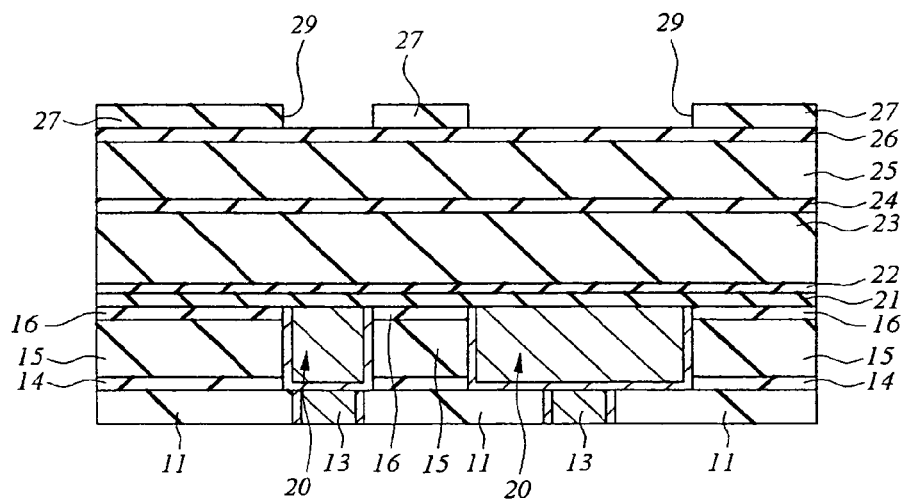
FIG. 9 is a sectional view showing the principal portion of the semiconductor device in the manufacturing process following FIG. 8.

Next, as shown in FIG. 8, a photoresist pattern 28 is formed on the insulating film 27 by use of a photolithography method. Then, as shown in FIG. 9, by using the photoresist pattern 28 as an etching mask, the insulating film 27 is dry etched. Thereby, openings 29 are formed in the insulating film 27. The opening 29 is formed in the area where a wiring groove is to be formed. Thereafter, the photoresist pattern 28 is removed.

Figure 10:
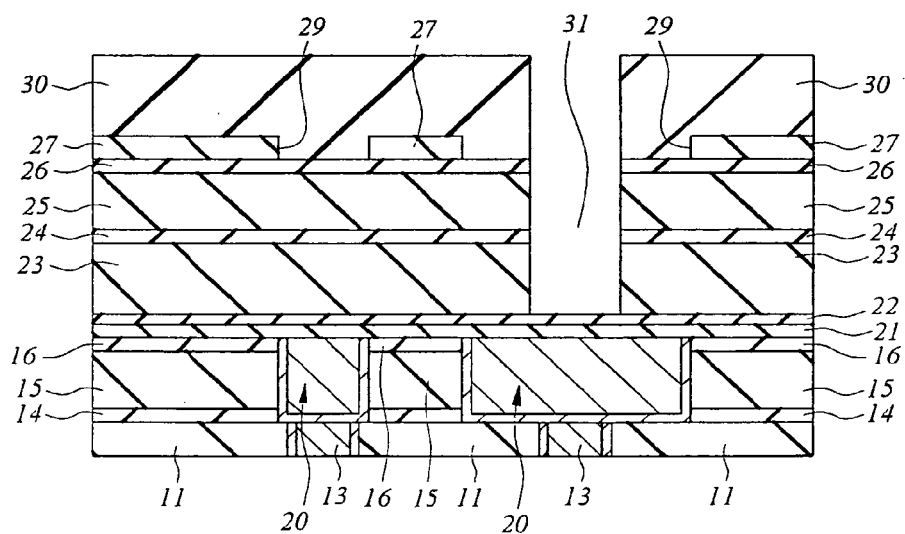
FIG. 10 is a sectional view showing the principal portion of the semiconductor device in the manufacturing process following FIG. 9.

Next, as shown in FIG. 10, a photoresist film is formed on the insulating film 27 so as to fill the openings 29 therewith, and the photoresist film is exposed, developed and patterned, and thereby a photoresist pattern 30 is formed. Then, by using the photoresist pattern 30 as an etching mask, the insulating films 26, 25, 24, and 23 are dry etched. Thereby, an opening 31 is formed in the insulating films 23 to 26. The opening 31 is formed in the area where a via (hole) is to be formed. Therefore, a plane area of the opening 31 is included in that of the opening 29. Further, by making the insulating film 22 (and the insulating film 21) function as an etching stopper film at the time of the dry etching, the insulating films 22 and 21 are left on the bottom of the opening 31 so that the upper surface of the wiring 20 cannot be exposed. Thereby, it is possible to prevent the formation of a natural oxide film on the wirings 20. Also, by the dry etching, it is possible to prevent copper in the main conductive film 19 of the wiring 20 from flying in all directions. Thereafter, the photoresist pattern 30 is removed.

Figure 11:
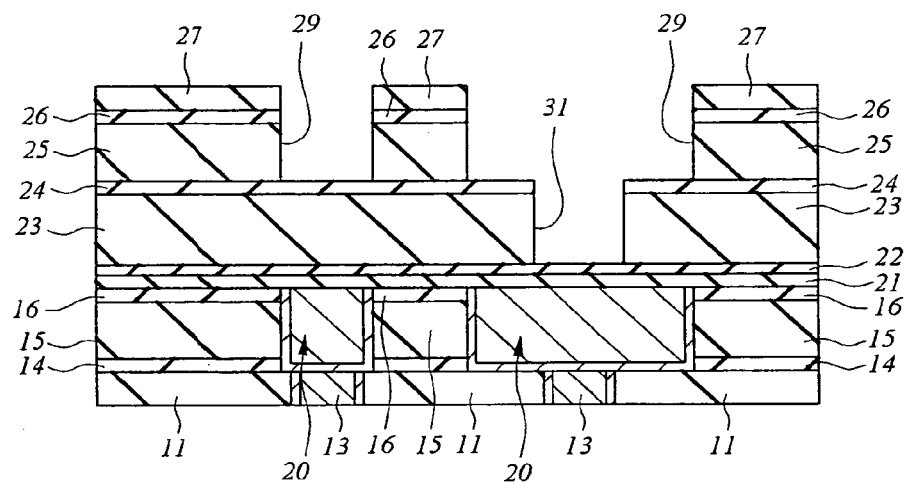
FIG. 11 is a sectional view showing the principal portion of the semiconductor device in the manufacturing process following FIG. 10.

Next, as shown in FIG. 11, by using the insulating film 27 as an etching mask (hard mask), the insulating films 26 and 25 are dry etched. Thereby, the openings 29 are formed in the insulating films 24 to 27. Since the insulating films 21 and 22 exist (remain) at the bottom of the opening 31 at the time of the etching, the wiring 20 can be prevented from being etched.

Figure 12:
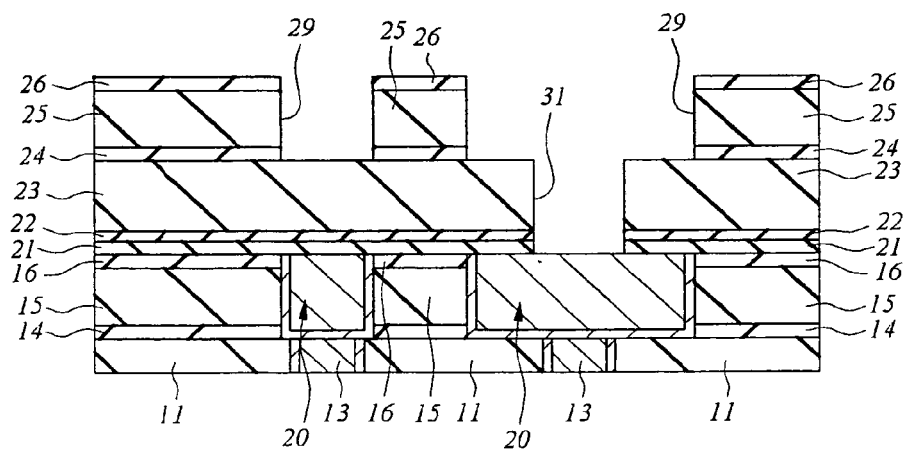
FIG. 12 is a sectional view showing the principal portion of the semiconductor device in the manufacturing process following FIG. 11.

Next, as shown in FIG. 12, the insulating film 24 is removed at the bottom of the opening 29 by the dry etching, and the insulating films 22 and 21 are removed at the bottom of the opening 31 by the dry etching. Thereby, the upper surface of the wiring 20 is exposed from the bottom of the opening 31. Then, the insulating film 27 is removed by the dry etching. The insulating film 27 can be removed by the same dry etching as that in the step of removing the insulating films 22 and 21 at the bottom of the opening 31, or by another dry etching different therefrom. The insulating film 26 left after removing the insulating film 27 can function as a protective film or the like in the CMP treatment.

Next, copper oxide formed on the surface of the wiring 20 (lower copper wiring) exposed from the bottom of the opening 31 is removed, and a cleaning treatment of the exposed upper surface of the wiring 20 is performed. This cleaning treatment can be performed by reducing, into copper (Cu), copper oxide (CuO, $Cu_2O$, $CuO_2$) on the surface of the copper wiring using a reducing plasma treatment such as a hydrogen ($H_2$) plasma treatment.

Figure 13:
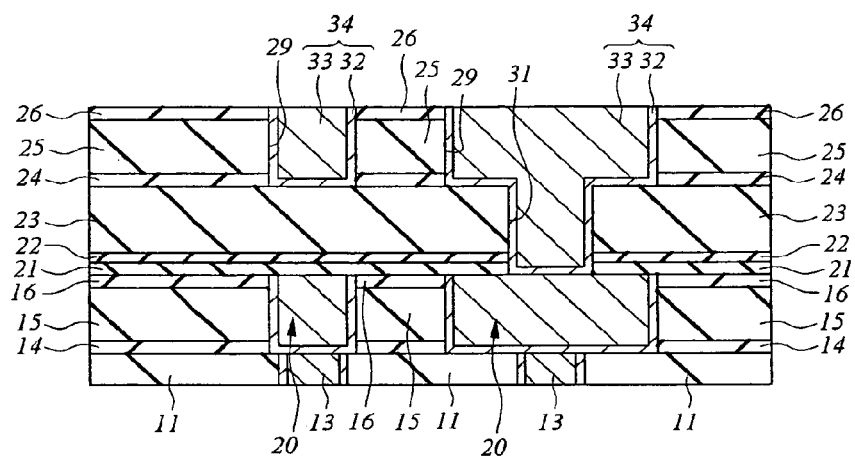
FIG. 13 is a sectional view showing the principal portion of the semiconductor device in the manufacturing process following FIG. 12.

Next, as shown in FIG. 13, on the insulating film 26 including the bottoms and side surfaces of the openings 29 and 31, a conductive barrier film 32 made of the same material as that of the conductive barrier film 18 is formed by using the same manner. Then, on the conductive barrier film 32, a main conductive film 33 made of the same material as that of the main conductive film 19 is formed by using the same manner so as to fill the insides of the openings 29 and 31 therewith, and the main conductive film 33 and the conductive barrier film 32 are polished by, for example, the CMP method until the upper surface of the insulating film 26 is exposed. The unnecessary conductive barrier film 32 and main conductive film 33 on the insulating film 26 are removed, and the conductive barrier film 32 and the main conductive film 33 are left in the openings 29 and 31 serving as wiring openings, and thereby, as shown in FIG. 13, wirings (second layer wirings) 34 consisting of the relatively thin conductive barrier film 32 and the relatively thick main conductive film 33 are formed in the openings 29 and 31. A portion of the wiring comprising the conductive barrier film 32 and the main conductive film 33 embedded in the opening (wiring groove) 29 is electrically connected to the wiring 20 serving as a lower layer wiring, through a via portion consisting of the conductive barrier film 32 and the main conductive film 33 embedded in the opening (via) 31.

Figure 14:
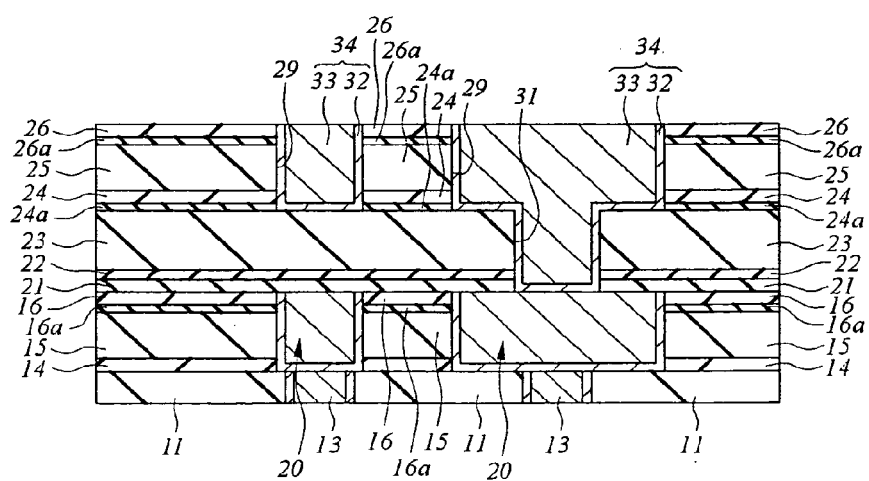
FIG. 14 is a sectional view showing the principal portion of a semiconductor device in a manufacturing process of another embodiment.

In the present embodiment, on the insulating films 15, 23, and 25 made of the low dielectric constant materials, the insulating films 16, 24, and 26 made of silicon oxide (or silicon oxynitride) and the like are formed. As another aspect, for example, if the insulating films 15, 23, and 25 are made of the low dielectric materials that can be damaged by an oxygen plasma, a thin insulating film, for example, a silicon carbide (SiC) film is formed on the insulating films 15, 23, and 25 without using an oxidizing plasma such as an oxygen ($O_2$) plasma and thereby the insulating films 16, 24, and 26 are formed thereon. FIG. 14 is a sectional view showing the principal portion of a semiconductor device in the manufacturing process according to another embodiment, and corresponds to FIG. 13. In FIG. 14, on the insulating films 15, 23, and 25 made of the low dielectric constant materials, insulating films 16a, 24a, and 26a each formed of a thin insulating film formed without using the oxidizing plasma such as the oxygen ($O_2$) plasma, for example, of a silicon carbide (SiC) film are formed, and thereby the insulating films 16, 24, and 26 made of silicon oxide (or silicon oxynitride) and the like are formed on the insulating films 16a, 24a, and 26a. Therefore, it is possible to prevent damages (deterioration in quality) of the insulating films 15, 23, and 25 and improve adhesiveness between the insulating films 15, 23, and 25 and the insulating films 16, 24, and 26.

Figure 15:
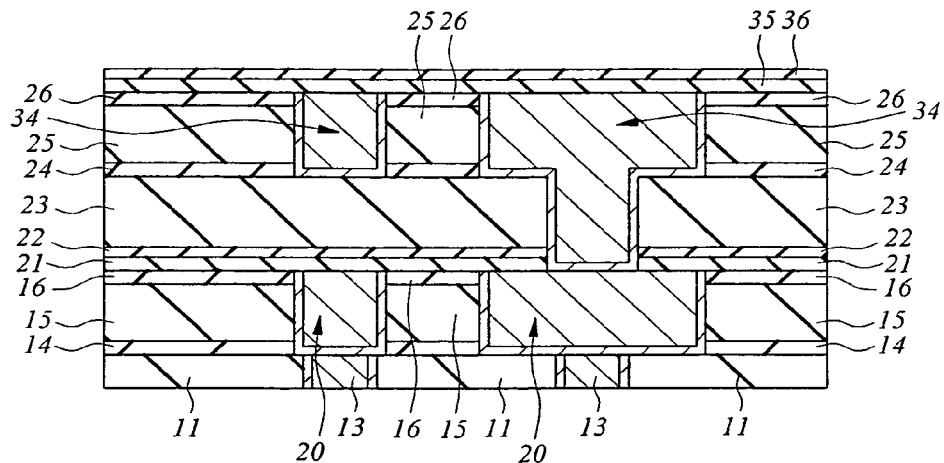
FIG. 15 is a sectional view showing the principal portion of the semiconductor device in the manufacturing process following FIG. 13.
Figure 16:
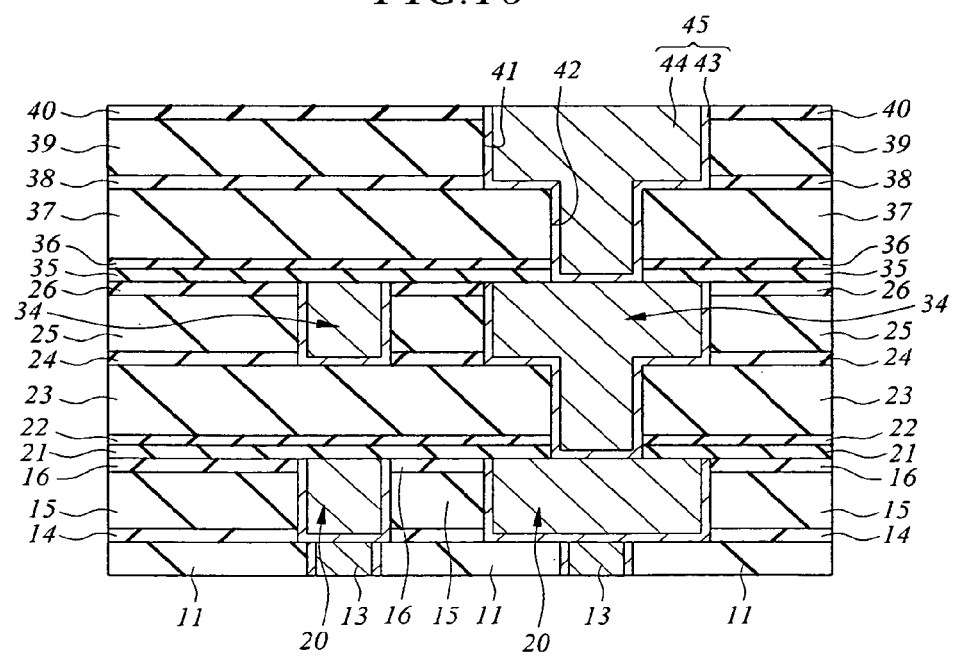
FIG. 16 is a sectional view showing the principal portion of the semiconductor device in the manufacturing process following FIG. 15.

FIGS. 15 and 16 show sectional views showing the principal portion of the semiconductor device in the manufacturing process following FIG. 13. Note that also in FIGS. 15 and 16, the portions corresponding to the structure illustrated below the insulating film 11 in FIG. 1 will be omitted.

After obtaining the structure shown in FIG. 13, the semiconductor substrate 1 is put in the processing room of the plasma CVD apparatus, and an ammonia gas is introduced and plasma power source is supplied, and then the ammonia ($NH_3$) plasma treatment is performed to the semiconductor substrate 1 (especially the CMP surface where the wirings 34 are exposed). Or, a $N_2$ and $H_2$ gas is introduced to perform a $N_2/H_2$ plasma treatment. By such a reducing plasma treatment, oxide copper (CuO, $Cu_2O$, $CuO_2$) of the copper wiring surface oxidized by the CMP is reduced to copper (Cu), and further a copper nitride (CuN) layer is formed on the surface (extremely thin area) of the wiring 20.

Then, after the cleaning is performed as occasion demands, as shown in FIG. 15, over the entirety of the main surface of the semiconductor substrate 1, an insulating film (first barrier insulating film) 35 and an insulating film (second barrier insulating film) 36 made of the same materials as and having the same functions as those of the above-mentioned insulating films 21 and 22 are formed in this order by using the same manners. Namely, on the insulating film 26 including the upper surfaces of the wirings 34, the insulating films 35 and 36 are formed in this order. Thereby, it is possible to adequately prevent the diffusion of copper in the main conductive film 33 of the wiring 34 and improve the adhesiveness to an insulating film 37 (interlayer insulating film, low dielectric constant material film) to be formed on the insulating film 36.

Then, as shown in FIG. 16, the insulating film (low dielectric constant material film) 37, an insulating film (silicon oxide film) 38, an insulating film (low dielectric constant material film) 39 and an insulating film (silicon oxide film) 40 are formed on the insulating film 36 in the same manners as those of the insulating films 23, 24, 25, and 26. An opening (wiring groove) 41 is formed in the insulating films 38, 39, and 40 and an opening (via) 42 is formed in the insulating films 35, 36, and 37 in the same manners as those of the openings 29 and 31. A wiring (third layer wiring) 45, comprising a conductive barrier film 43 and a main conductive film (copper film) 44 in which the openings 41 and 42 are embedded, is formed in the same manner as that of the wiring 34. Thereafter, a barrier insulating film is formed, on the insulating film 40 including the upper surface of the wiring 45, in the same manner as those of the above-mentioned insulating films 21 and 22, and an interlayer insulating film (low dielectric constant material film) and the like are formed on the barrier insulating film, and further the upper layer wiring is formed. However, the explanation thereof will be omitted herein.

Examinations by the present inventors have found that, in the semiconductor device having embedded copper wirings, the electric resistance of the embedded copper wiring is increased due to the stress migration when it is left to stand at high temperature. At this time, an air gap or a void is formed between the upper surface of the lower layer embedded copper wiring and the via portion of the upper layer embedded copper wiring. For this reason, an area of the connection between the lower layer embedded copper wiring and the upper layer embedded copper wiring is reduced, whereby the increase in the electric resistance occurs. Further, there is the drawback of the occurrence of the disconnection between the lower layer embedded copper wiring and the upper layer embedded copper wiring since the void is formed. These result in reductions of the reliability of the wirings and the manufacturing yields of the semiconductor devices, and in an increase of the manufacturing costs.

Additionally, in the semiconductor device having the embedded copper wiring, it is also required to improve TDDB (Time Dependence on Dielectric Breakdown) life of the embedded copper wiring. Note that the term "TDDB life" means a scale for objectively measuring the time dependence of dielectric breakdown, wherein a relatively high voltage is impressed between electrodes under the measurement condition of the specified temperature (for example, 140° C.), and a graph in which the time from the impression of voltage to the dielectric breakdown is plotted in regard to an impressed electric field is prepared, and the time (life) obtained from this graph by extrapolating the strength of the actually used electric field (for example, 0.2 MV/cm) is called the TDDB time. According to the examinations by the present inventors, it has been found that in the TDDB life tests, copper ions in the wiring are drifted by the electric field exerted between the adjacent wirings in the embedded copper wirings disposed on the same layer, whereby the dielectric breakdown is caused.

Therefore, it is required to prevent the deterioration in the embedded copper wirings due to the stress migration and improve the TDDB life.

In the present embodiment, as barrier insulating films to cover the upper surface of the lower layer copper wiring (e.g., wiring 20), the first barrier insulating film (e.g., insulating film 21) and the second barrier insulating film (e.g., insulating film 22) are used, near the bottom of the via portion (e.g., conductive barrier film 32 and main conductive film 33 embedded in the opening 31) of the upper layer copper wiring (e.g., wiring 34). As a first barrier insulating film disposed on a lower layer side (e.g., insulating film 21), a material film with excellent barrier properties to copper (e.g., silicon carbonitride (SiCN) film) is used, and as a second barrier insulating film disposed on an upper layer side (e.g., insulating film 22), a material film (e.g., silicon carbide (SiC) film) with excellent adhesiveness to the interlayer insulating film (low dielectric constant material film, e.g., insulating film 23) is used. Thereby, it is possible to prevent the diffusion of copper in the copper wiring (e.g., wiring 20) and improve the adhesiveness between the barrier insulating film (e.g., insulating films 21 and 22) and the interlayer insulating film (low dielectric constant material film, e.g., insulating film 23).

Figure 17:
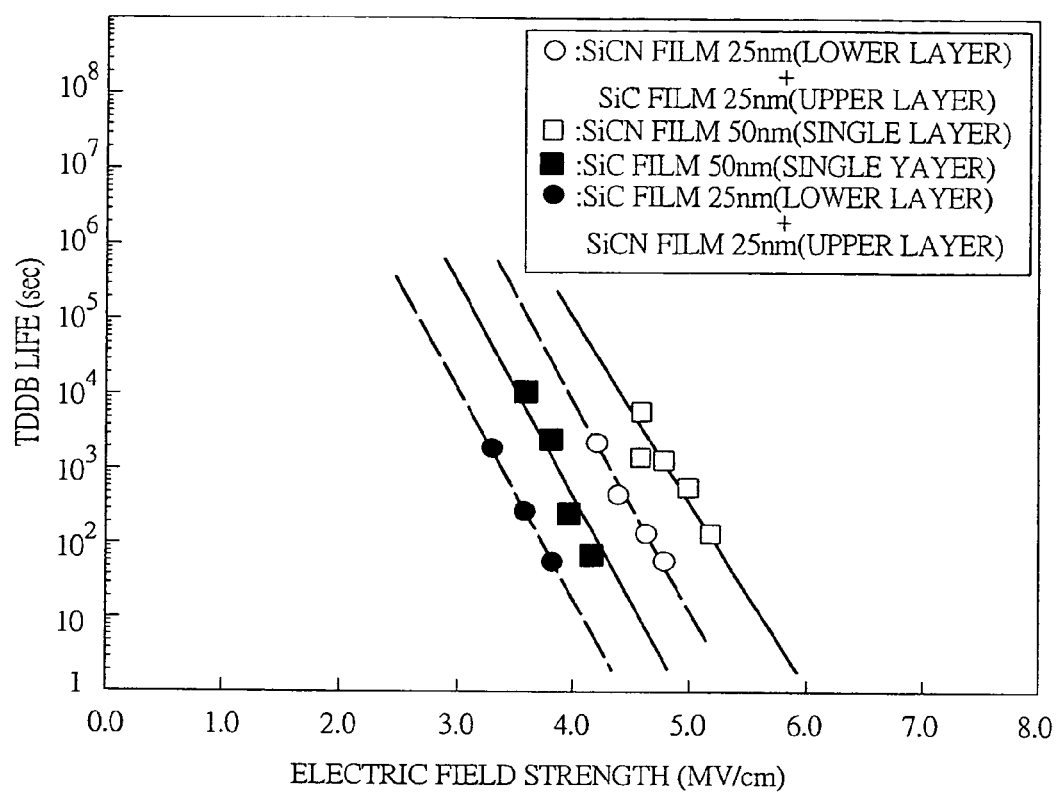
FIG. 17 is a graph showing the results of TDDB life tests of embedded copper wirings.

FIG. 17 is a graph showing the results of the TDDB life tests of embedded copper wirings. The horizontal axis of the graph in FIG. 17 corresponds to the strength of the electric field impressed between the wirings, and the vertical axis corresponds to the time from the impression of the voltage to the dielectric breakdown. The time (life) obtained from this graph by extrapolating the strength of the actually used electric field (e.g., 0.2 MV/cm) can be considered as the TDDB life.

In FIG. 17, in addition to the case of using a 25 nm thick silicon carbonitride (SiCN) film as a first barrier insulating film (lower layer) and a 25 nm thick silicon carbide (SiC) film as a second barrier insulating film (upper layer) as shown in the present embodiment (this case corresponding to white circles in the graph in FIG. 17), there are also described the cases of using: a single layer of a 50 nm thick silicon carbonitride (SiCN) film as a barrier insulating film, which is a first comparison example (this case corresponding to white squares in the graph in FIG. 17 and to the case of omitting the formation of the second barrier insulating film in comparison to the present embodiment); a single layer of a 50 nm thick silicon carbide (SiC) film as a barrier insulating film, which is a second comparison example (this case corresponding to black squares in the graph in FIG. 17 and to the case of omitting the formation of a first barrier insulating film in comparison to the present embodiment); and a 25 nm thick silicon carbide (SiC) film as a first barrier insulating film (lower layer) and a 25 nm thick silicon carbonitride (SiCN) film as a second barrier insulating film (upper layer), which are a third comparison example (this case corresponding to black circles in the graph in FIG. 17 and to the case where the first and second barrier insulating films are inverted in comparison to the present embodiment).

As seen from the graph in FIG. 17, in the present embodiment, since the barrier insulating films are formed as a laminating structure and a silicon carbonitride (SiCN) film having excellent barrier properties to copper is used in the first barrier insulating film contacting to the embedded copper wiring, it is possible to properly restrain or prevent the diffusion of copper in wirings and make the TDDB life of the wiring relatively long (good). Meanwhile, if the silicon carbide (SiC) film whose barrier properties to copper is relatively inferior is used in the barrier insulating film contacting to the embedded copper wiring (this case corresponding to the above-mentioned second and third comparison examples), then the copper in the wiring is easy to diffuse and the TDDB life of the wiring deteriorates. As described in Non-patent Document 1, it is possible to improve the TDDB life of the wirings, by employing the silicon carbonitride (SiCN) film having relatively excellent barrier properties to copper rather than the silicon carbide (SiC) film using as the barrier insulating film contacting to the embedded copper wiring.

Figure 18:
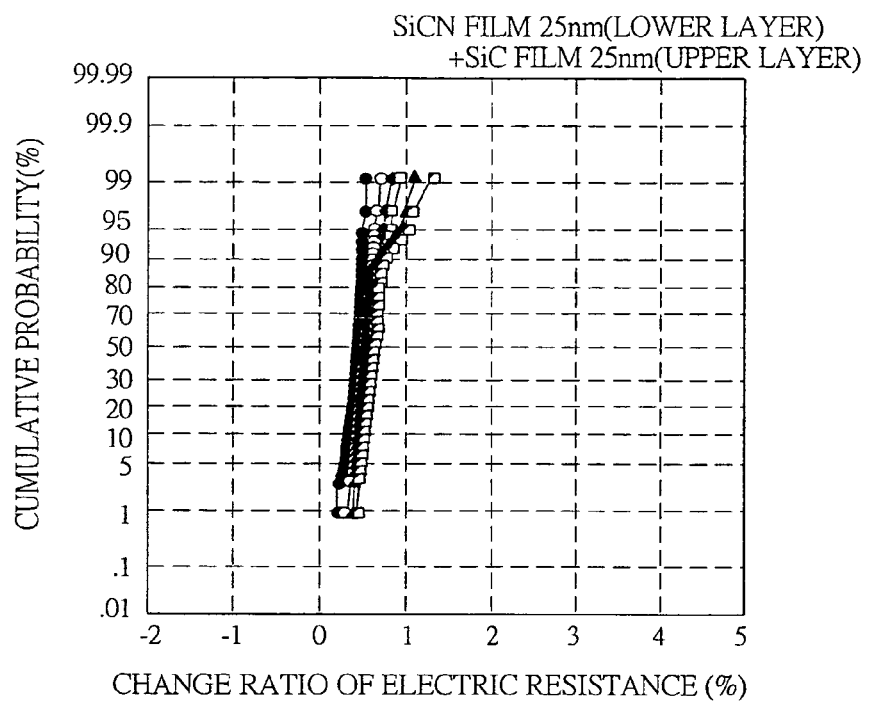
FIG. 18 is a graph showing resistance-rising ratios obtained after tests in which embedded copper wirings are left to stand at a high temperature.
Figure 19:
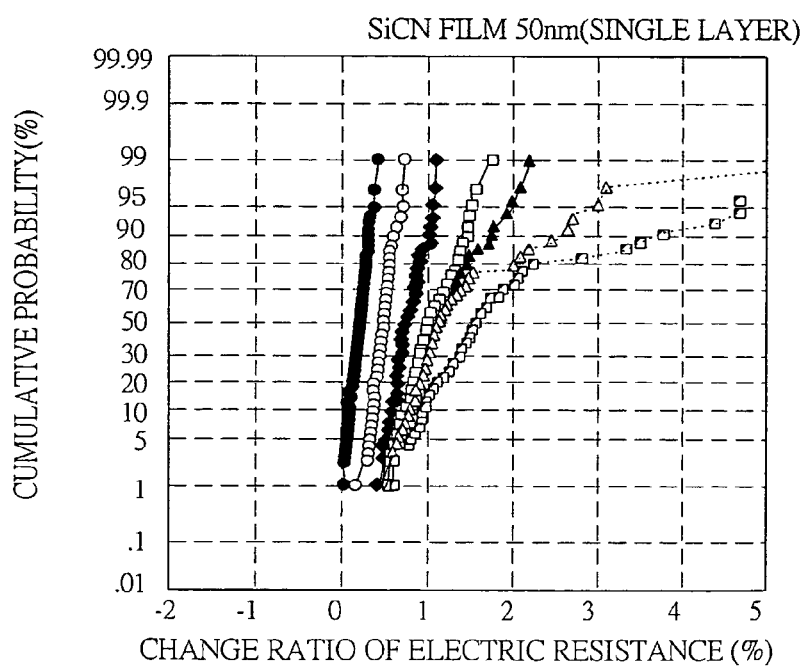
FIG. 19 is a graph showing resistance-rising ratios obtained after tests in which embedded copper wirings are left to stand at a high temperature.
Figure 20:
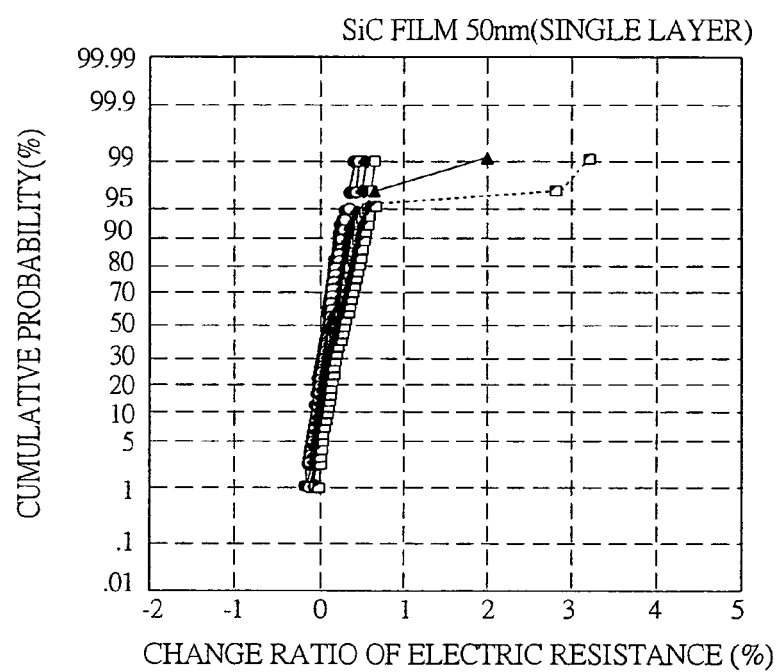
FIG. 20 is a graph showing resistance-rising ratios obtained after tests in which embedded copper wirings are left to stand at a high temperature.

FIGS. 18 to 20 each are a graph showing the resistance-rising ratio obtained after tests in which the embedded copper wirings are left to stand at the high temperature (e.g., being left at 150° C. for 100 hours). Each horizontal axis in the graphs in FIG. 18 to FIG. 20 corresponds to a change ratio or rise ratio (increase ratio of the electric resistance obtained by regarding the electric resistance before being left to stand at the high temperature test as a standard), and each vertical axis in the graphs in FIG. 18 to FIG. 20 corresponds to the cumulative distribution or the cumulative probability. FIG. 18 corresponds to the case of using, as barrier insulating films of the embedded copper wirings, the laminated film of the first barrier insulating film (lower layer) formed of a silicon carbonitride (SiCN) film (herein having a thickness of 25 nm) and the second barrier insulating film (upper layer) formed of a silicon carbide (SiC) film (herein with a thickness of 25 nm) thereon. Further, FIG. 19 corresponds to the case of the above-mentioned first comparison example using, as the barrier insulating film of the embedded copper wiring, a single layer of a 50 nm thick silicon carbonitride (SiCN) film. Also, FIG. 20 corresponds to the case of the above-mentioned second comparison example using, as the barrier insulating film of the embedded copper wiring, a single layer of a 50 nm thick silicon carbide (SiC) film. Additionally, in each of FIGS. 18 to 20, experiments have been conducted for the case where the values of the wiring width are variously changed, and the results thereof are plotted.

As seen from FIGS. 18 to 20, by being left to stand at the high temperature, the electric resistance of the embedded copper wiring is increased. In each of FIGS. 18 to 20, when the wiring width is set large, there is a trend toward the fact that the rise ratio of the electric resistance of the embedded copper wiring often becomes large.

In the case of the above-mentioned first comparison example in which the silicon carbonitride (SiCN) film having relatively low adhesiveness to the low dielectric constant material film is used as a barrier insulating film and the low dielectric constant material film is formed as an interlayer insulating film on the silicon carbonitride (SiCN) film, the rise ratio of the electric resistance of the embedded copper wiring by being left to stand at the high temperature becomes large, as shown in FIG. 19. It is thought that this is because when the low dielectric constant material film as an interlayer insulating film is formed on the silicon carbonitride (SiCN) film as a barrier insulating film, the adhesiveness (adhesion properties) between the barrier insulating film and the low dielectric constant material film declines near the bottom of the via portion of the upper layer copper wiring, wherein failures due to the stress migration are easy to generate.

In contrast to this, as shown in FIG. 18 in the present embodiment, it is possible to restrain the rise of the electric resistance of the embedded copper wiring caused by being left to stand at the high temperature, and to restrain or prevent occurrence of the failures due to the stress migration.

In the present embodiment, since the barrier insulating films are formed as a laminating structure and the film having excellent adhesiveness to the low dielectric constant material film (silicon carbide (SiC) film) is used as the second barrier insulating film contacting to the low dielectric constant material film, it is possible to improve the adhesiveness between the barrier insulating films (e.g., insulating films 21 and 22) and the interlayer insulating film (low dielectric constant material film, e.g., insulating film 23). Therefore, it is possible to improve the adhesiveness (adhesive strength) between the barrier insulating films (e.g., insulating films 21 and 22) and the interlayer insulating film (e.g., insulating film 23) near the bottom of the via portion (e.g., conductive barrier film 32 and main conductive film 33 embedded in the opening 31) of the upper layer copper wiring (e.g., wiring 34), and further to restrain or prevent the drawback due to the above-mentioned stress migration, for example, the occurrence of a gap or void between the via portion of the upper layer copper wiring (e.g., wiring 34) and the upper surface of the lower layer copper wiring (e.g., wiring 20), and the rise of the resistance between the upper layer copper wiring (e.g., wiring 34) and the lower layer copper wiring (e.g., wiring 20), etc.

Note that the above-mentioned effects can be attained also in the cases where: the wiring 20 is applied as the lower layer copper wiring and the wiring 34 is applied as the upper layer copper wiring; the wiring 34 is applied as the lower layer copper wiring and the wiring 45 is applied as the upper layer copper wiring; and the wiring 45 is applied as the lower layer copper wiring and a further upper layer wiring (not illustrated) on the wiring 45 is applied as the upper layer copper wiring.

In the present embodiment, it is possible to improve not only the barrier properties to copper between the copper wiring and the barrier insulating film (prevention of the diffusion of copper) but also the adhesiveness between the barrier insulating film and the interlayer insulating film (low dielectric constant material film), whereby the improvements in the TDDB life and the stress migration characteristics of the wirings can be achieved. Therefore, the reliability of the wirings can be improved. Additionally, it is possible to reduce the manufacturing yields of the semiconductor devices and further the manufacturing costs thereof.

Second Embodiment

Figure 21:
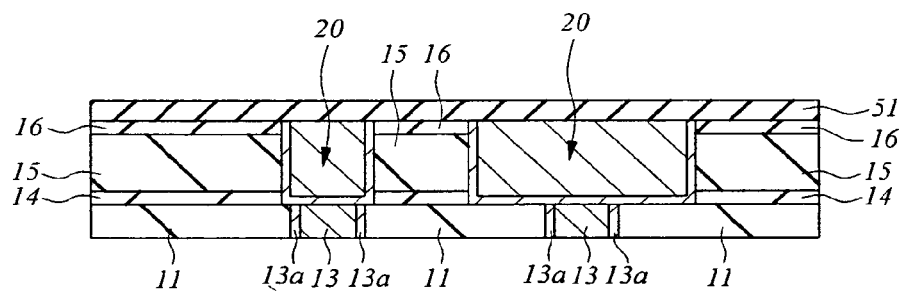
FIG. 21 is a sectional view showing the principal portion of a semiconductor device in a manufacturing process according to another embodiment of the present invention.
Figure 22:
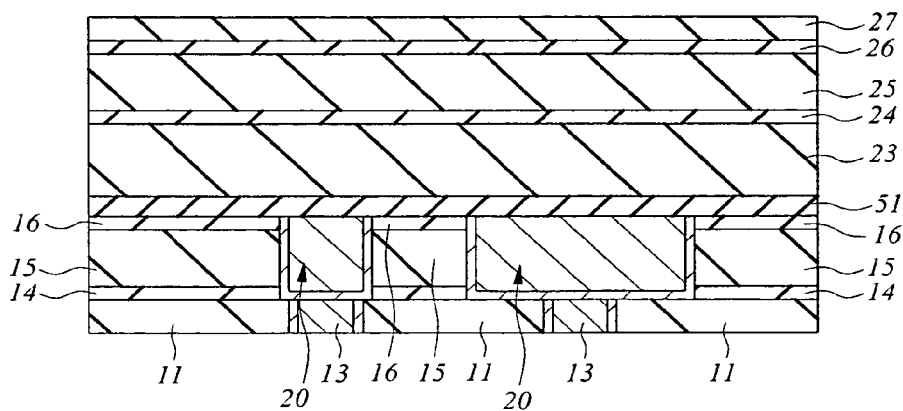
FIG. 22 is a sectional view showing the principal portion of the semiconductor device in the manufacturing process following FIG. 21.

FIGS. 21 and 22 each show a sectional view of the principal portion of the semiconductor device in the manufacturing process according to another embodiment of the present invention. Since the manufacturing process from FIG. 1 to FIG. 5 in this case are the same as that of the first embodiment, the explanation thereof will be omitted here and manufacturing process following FIG. 5 will be described hereinafter. Note that, also in FIGS. 21 and 22, the portions corresponding to the structure illustrated below the insulation film 11 in FIG. 1 will be omitted.

After the structure shown in FIG. 5 is obtained, similarly to the above-mentioned first embodiment, the reducing plasma treatment is performed and then the cleaning is performed as occasion demands. Thereafter, as shown in FIG. 21, an insulating film (barrier insulating film) 51 is formed by, for example, the plasma CVD method or the like over the entirety of the main surface of the semiconductor substrate 1. Namely, the insulating film 51 is formed on the insulating film 16 including the upper surfaces of the wirings 20.

The insulating film 51 is formed of a silicon carbonitride (SiCN) film, but a concentration distribution of nitrogen (N) in a thickness direction of the insulating film 51 is not uniform due to the below-mentioned reason.

Then, as shown in FIG. 22, on the insulating film 51, insulating films 23, 24, 25, 26, and 27 are formed similarly to the above-mentioned first embodiment.

Figure 23:
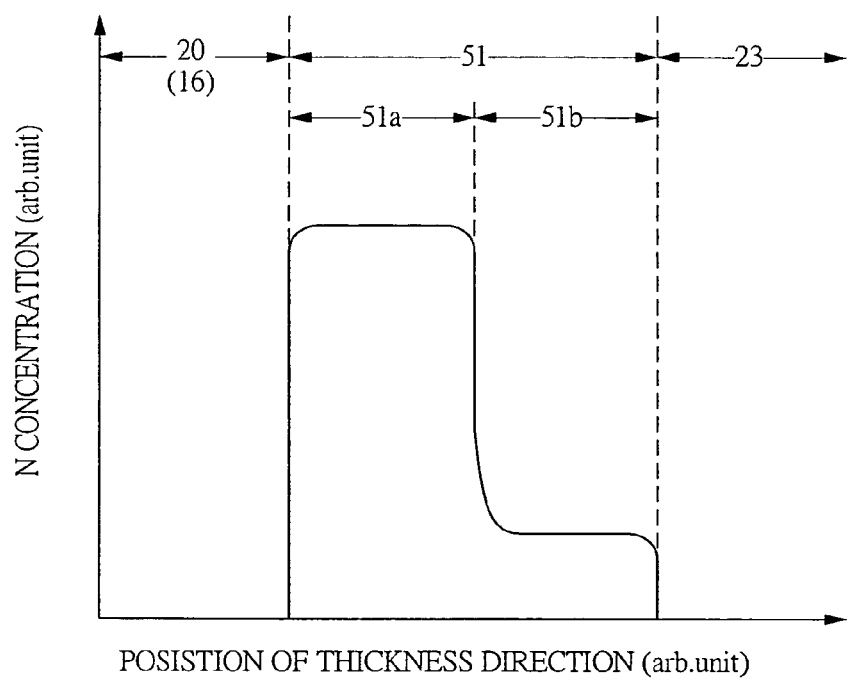
FIG. 23 is a graph showing a concentration distribution of nitrogen (N) in a thickness direction of an insulating film.

FIG. 23 is a graph schematically showing a concentration distribution of nitrogen (N) in a thickness direction (direction perpendicular to the main surface of the semiconductor substrate 1) of the insulating film 51. The horizontal axis of the graph in FIG. 23 corresponds to positions (arbitrary unit), in the thickness (film thickness) direction from an upper area of the wiring 20 (or the insulating film 16) disposing under the insulating film 51 to a lower area of the insulating film 23 disposing on the insulating film 51, and the vertical axis of the graph in FIG. 23 corresponds to a concentration of nitrogen (N) (arbitrary unit) in the film.

As shown in the graph in FIG. 23, in the present embodiment, the nitrogen (N) concentration in the insulating film 51 disposed near a region of the interface between the wiring 20 and the insulating film 51 is larger than that of the insulating film 51 disposed near a region of the interface between the insulating film 51 and the upper insulating film 23. For example, the insulating film 51 has a high nitrogen (N) concentration region 51a at the lower portion (on a side of the wiring 20 or insulating film 16) and a low nitrogen (N) concentration region at the upper portion thereof (on a side of the insulating film 23).

The insulating film 51 may be formed continuously by, for example, the CVD method using a nitrogen gas. For example, in the initial film-forming stage of the insulating film 51, the insulating film 51 in the high nitrogen concentration region 51a can be formed by relatively increasing a flow amount of nitrogen gas introduced to a film-forming apparatus, and in the latter film-forming stage of the insulating film 51, the insulating film 51 in the low nitrogen concentration region 51b can be formed by relatively decreasing the flow amount of nitrogen gas introduced to the film-forming apparatus. Also, in the latter film-forming stage of the insulating film 51, the introduction of the nitrogen gas to the film-forming apparatus is stopped (zero flow amount), whereby the nitrogen concentration in the low nitrogen concentration region 51b of the insulating film 51 may be made extremely small (or zero).

By increasing the nitrogen concentration in the silicon carbonitride (SiCN) film, it is possible to improve the barrier properties to copper (function of restraining or preventing the diffusion of copper) and enhance the breakdown property. Meanwhile, by decreasing the nitrogen concentration in the silicon carbonitride (SiCN) film, it is possible to improve the adhesiveness (adhesion properties) to the low dielectric constant material film. When the low dielectric constant material film is formed on the silicon carbonitride (SiCN) film whose nitrogen concentration is high, there is the drawback of the fact that the adhesiveness (adhesion properties) between the underlying film (film having a high nitrogen concentration) and the low dielectric constant material film can be reduced. This causes the peeling between the films, whereby the reliability of the wirings is reduced. Such a phenomenon can be generally caused in the above-mentioned low dielectric constant materials, and the occurrence thereof is especially prominent in the case of using a material containing silicon (Si), oxygen (O), and carbon (C) as the low dielectric constant material, and is more prominent in the case of using, for example, carbonated silicon (organic silicon glass, SiOC system material, for example, above-mentioned Black Diamond and the like), MSQ (methyl silsesquioxane) system material, or HSQ (hydrogen silsesquioxane) system material (including their porous materials) as the low dielectric constant material.

In the present embodiment, since the area that contacts to the wiring 20 of the insulating film 51 made of silicon carbonitride (SiCN) is used as the high nitrogen (N) concentration region 51a, copper of the wiring 20 can be adequately prevented from diffusing in the insulating film 51, and since the area that contacts to the insulating film (low dielectric constant material film) 23 of the insulating film 51 is used as the low nitrogen (N) concentration region 51b, the adhesiveness between the insulating film 51 and the insulating film (low dielectric constant material film) 23 can be improved. In this manner, since the nitrogen (N) concentration of the insulating film 51 in the area disposed near the interface between the wiring 50 and the insulating film 51 is made larger than that of the insulating film 51 in the area disposed near the interface between the insulating film 51 and the upper insulating film 23, it is possible to improve both of the barrier properties to copper in the insulating film 51 and the adhesiveness to the upper low dielectric constant material film. Further, the area that contacts to the insulating film (low dielectric constant material film) 23 of the insulating film 51 is constituted not by silicon carbide containing no nitrogen but by silicon carbonitride (SiCN). Therefore, it is possible to further enhance the function of the copper-diffusing prevention and the breakdown property in the entirety of the barrier insulating film 51.

Figure 24:
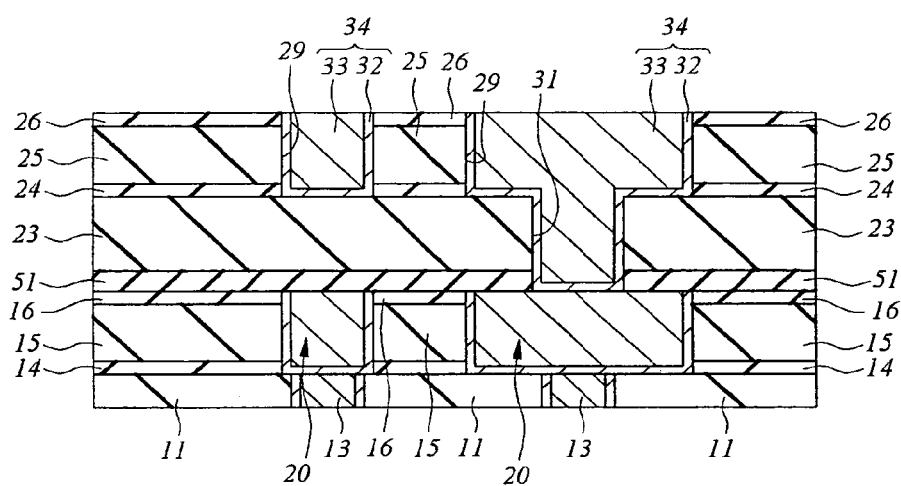
FIG. 24 is a sectional view showing the principal portion of the semiconductor device in the manufacturing process following FIG. 22.
Figure 25:
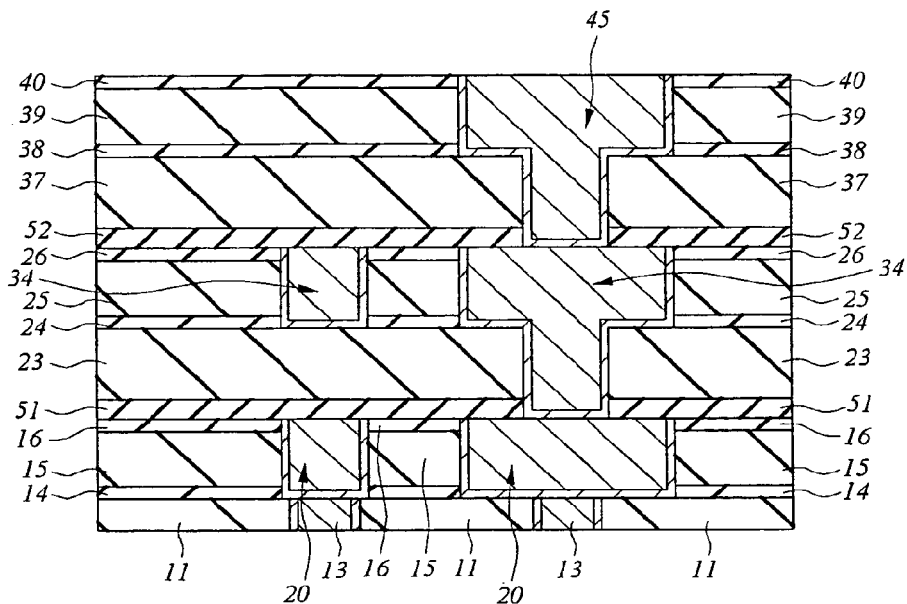
FIG. 25 is a sectional view showing the principal portion of the semiconductor device in the manufacturing process following FIG. 24.

FIGS. 24 and 25 each show a sectional view showing the principal portion of the semiconductor device in the manufacturing process following FIG. 22. Note that, also in both FIGS. 24 and 25, the portions corresponding to the structure illustrated below the insulating film 11 in FIG. 1 will be omitted.

After the structure shown in FIG. 22 is obtained, the same process as that corresponding to FIGS. 8 to 13 in the first embodiment are performed, and the openings 29 and 31 and the wiring 34 embedded therein are formed, and thereafter the structure shown in FIG. 24 is obtained. Then, as shown in FIG. 25, an insulating film 52, made of the same material as and having the same concentration distribution of nitrogen (N) as that of the insulating film 51, is formed as a barrier insulating film on the insulating film 26 including the upper surfaces of the wirings 34. Then, similarly to the first embodiment, on the insulating film 52 used as a barrier insulating film, insulating films 37, 38, 39, and 40 are formed and the openings 41 and 42 are formed and further a wiring 45 comprising a conductive barrier film 43 and a copper main conductive film 44, which are embedded in the openings 41 and 42, is formed. Thereafter, in the same manner as that for forming the insulating film 51, a barrier insulating film is formed on the insulating film 40 including the upper surface of the wiring 45, and an interlayer insulating film (low dielectric constant material film) and the like are formed on the barrier insulating film, and further an upper layer wiring is formed thereon. However, the explanation thereof will be omitted herein.

In the present embodiment, at the area near the bottom of the via portion (the conductive barrier film 32 and the main conductive 33 embedded in the opening 31) of the upper layer copper wiring (wiring 34), the insulating film 51 is used as a barrier insulating film for covering the upper surface of the lower layer copper wiring (the wiring 20). The insulating film 51 is formed of a silicon carbonitride (SiCN) film, but the concentration distribution of nitrogen (N) in the thickness direction of the insulating film 51 is not uniform. In the present embodiment, the nitrogen (N) concentration of the insulating film 51 at the area disposed near the interface between the wiring 20 and the insulating film 51 is larger than that of the insulating film 51 at the area disposed near the interface between the insulating film 51 and the upper insulating film 23. Therefore, it is possible to achieve both improvements of the barrier properties (diffusion prevention) to copper between the copper wiring (wiring 20) and the barrier insulating film (insulating film 51) and of the adhesiveness between the barrier insulating film (insulating film 51) and the interlayer insulating film (low dielectric constant material film, insulating film 23). Such effects can be obtained respectively from the insulating film 51 used as the barrier insulating film of the wiring 20, the insulating film 52 used as the barrier insulating film of the wiring 34, and the barrier insulating film (not illustrated) of the wiring 45. For this reason, it is possible to realize improvements of the TDDB life and the stress migration characteristics of the wirings. Therefore, the reliability of the wirings can be improved. Additionally, it is possible to improve the manufacturing yields and reduce the manufacturing costs of the semiconductor devices.

Further, the first embodiment and the present embodiment can be used in combination. Namely, the wiring (wiring layer) using the barrier insulating film comprising a laminated film of the insulating films 21 and 22 (or the insulating films 35 and 36) as described in the first embodiment, and the wiring (wiring layer) using the barrier insulating film comprising the insulating film 51 (or insulating film 52) as described in the present embodiment can be also used in combination.

Third Embodiment

FIGS. 26 to 32 show sectional views showing the principal portion of the semiconductor device in the manufacturing process according to another embodiment of the present invention. Since the manufacturing process in shown in FIGS. 1 to 9 in this case is the same as that of the first embodiment, the explanations thereof will be omitted here and the manufacturing process following FIG. 9 will be explained hereinafter. Note that, also in FIGS. 26 to 32, the portions corresponding to the structure illustrated below the insulation film 11 in FIG. 1 will be omitted.

Figure 26:
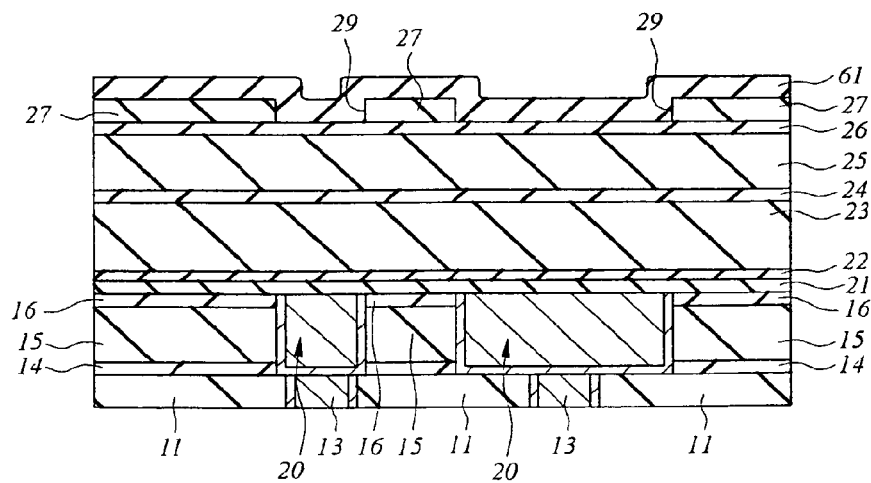
FIG. 26 is a sectional view showing the principal portion of a semiconductor device in a manufacturing process according to another embodiment of the present invention.

After the structure shown in FIG. 9 is obtained, as shown in FIG. 26, an insulating film 61 as a second hard mask layer is formed on the insulating film 27 so as to fill the opening 29 therewith. The insulating film 61 may be made of such a material as, for example, a silicon oxide (SiO) film, silicon oxynitride (SiON) film, silicon oxycarbide (SiOC) film or the like, whose an etching selection ratio is different from those of the insulating films 24 and 27 and also from the insulating film 25.

Figure 27:
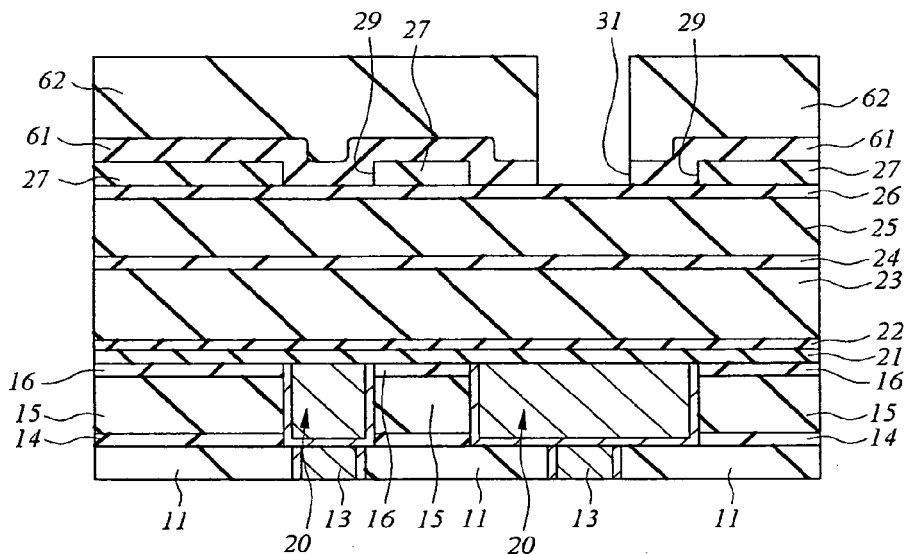
FIG. 27 is a sectional view showing the principal portion of the semiconductor device in the manufacturing process following FIG. 26.

Next, as shown in FIG. 27, a photoresist film is formed on the insulating film 61 and the photoresist film is exposed, developed and patterned, whereby a photoresist pattern 62 is formed. Then, by using the photoresist pattern 62 as an etching mask, the insulating film 61 is dry etched to form an opening 31 in the insulating film 61. Note that the opening 31 is formed in the area for forming a via and a plane area of the opening (via) 31 is included in that of the opening (wiring groove) 29. Thereafter, the photoresist pattern 62 is removed by the ashing or the like.

Figure 28:
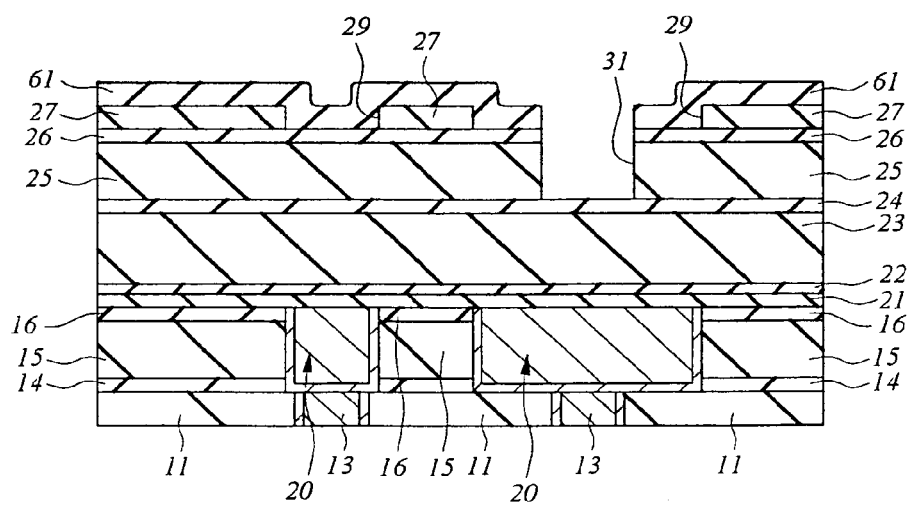
FIG. 28 is a sectional view showing the principal portion of the semiconductor device in the manufacturing process following FIG. 27.

Then, as shown in FIG. 28, by using the insulating film 61 as an etching mask (hard mask), the insulating films 26 and 25 are dry etched at the bottom of the opening 31. Thereafter, the insulating film 61 is removed by the dry etching or the like.

Figure 29:
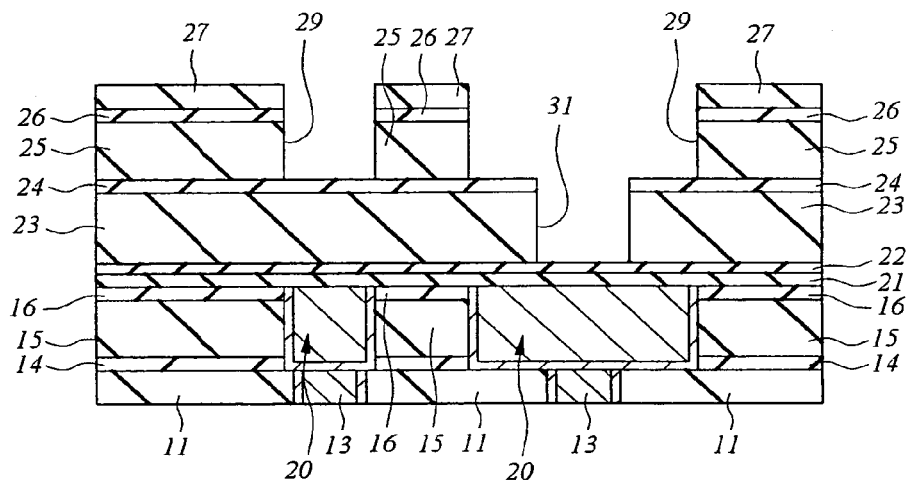
FIG. 29 is a sectional view showing the principal portion of the semiconductor device in the manufacturing process following FIG. 28.

Next, as shown in FIG. 29, by using the insulating film 27 as an etching mask (hard mask), the insulating films 26 and 25 are dry etched at the bottom of the opening 29, and the insulating films 24 and 23 are dry etched at the bottom of the opening 31. At the time of this dry etching, the insulating film 22 (and the insulating film 21) functions as an etching stopper film. Since the insulating films 21 and 22 exist (remain) at the bottom of the opening 31, it is possible to prevent the wirings 20 from being etched.

Figure 30:
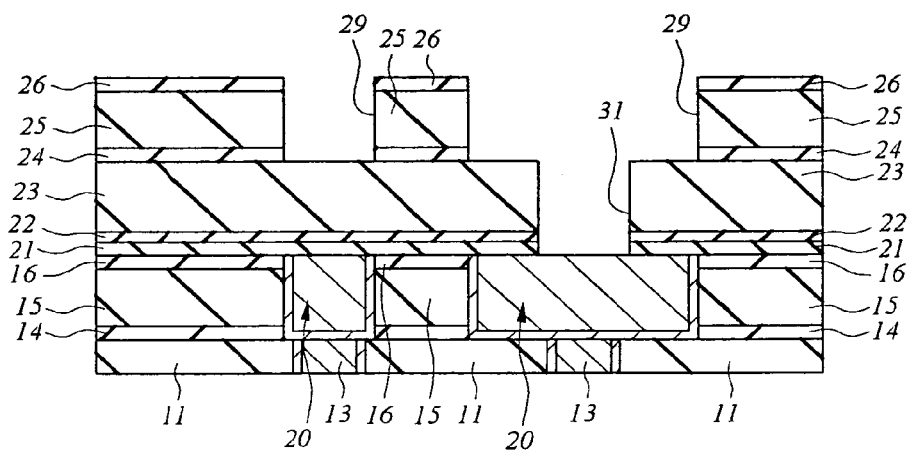
FIG. 30 is a sectional view showing the principal portion of the semiconductor device in the manufacturing process following FIG. 29.

Next, as shown in FIG. 30, the insulating film 24 is removed by the dry etching at the bottom of the opening 29, and the insulating films 22 and 21 are removed by the dry etching at the bottom of the opening 31. In this manner, the upper surface of the wiring 20 is exposed from the bottom of the opening 31. Further, the insulating film 27 is removed by the dry etching. The insulating film 27 may be removed by the same dry etching as that in the step of removing the insulating films 22 and 21 at the bottom of the opening 31, or by another dry etching different therefrom. The insulating film 26 left after removing the insulating film 27 can function as a protective film and the like in the CMP treatment.

Figure 31:
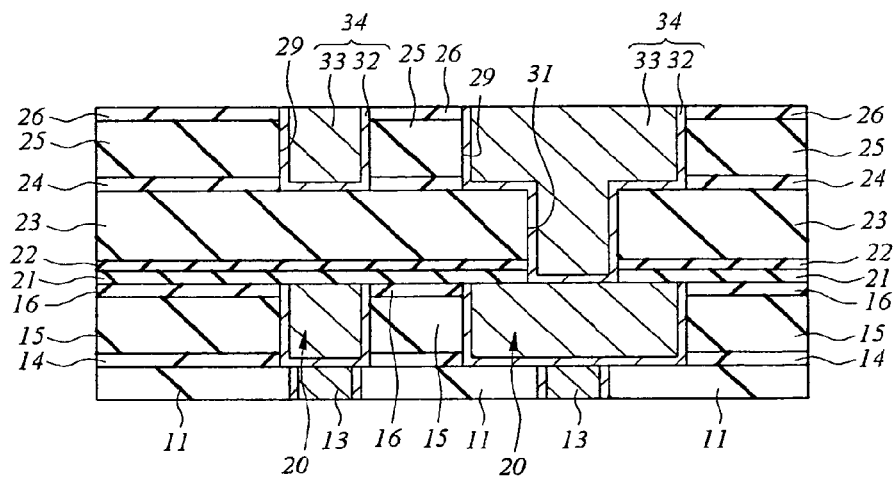
FIG. 31 is a sectional view showing the principal portion of the semiconductor device in the manufacturing process following FIG. 30.
Figure 32:
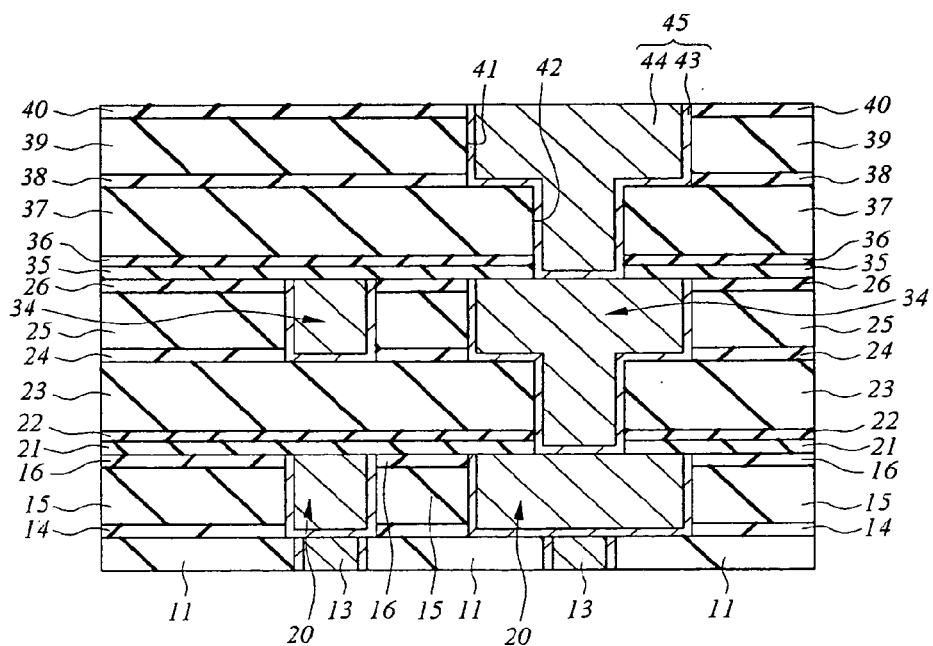
FIG. 32 is a sectional view showing the principal portion of the semiconductor device in the manufacturing process following FIG. 31.

Next, as shown in FIG. 31, in the same manners as those in the first embodiment, the conductive barrier film 32 and the wiring 34 comprising the main conductive film 33 of copper are formed in the openings 29 and 31. Then, as shown in FIG. 32, on the insulating film 26 including the upper surfaces of the wirings 34 in the same manners as those in the first embodiment, insulating films 35, 36, 37, 38, 39, and 40 are formed; by using the same step as that of forming the openings 29 and 31 in the present embodiment, openings 41 and 42 are formed in the insulating films 35 to 40; and, in the same manners as those in the first embodiment, a wiring 45 comprising a conductive barrier film 43 and a main conductive film 44 of copper are formed in the openings 41 and 42. Thereafter, on the insulating film 40 including the upper surface of the wiring 45, a barrier insulating film is formed in the same manners as those of the above-mentioned insulating films 21 and 22, and further an interlayer insulating film (low dielectric constant material film) and the like are formed on the barrier insulating film, and further an upper layer wiring is formed thereon. However, the explanations thereof will be omitted herein.

In the present embodiment, the same effects as those in the first embodiment can be attained. Further, in the present embodiment, when the insulating films 23 and 25 formed of low dielectric constant materials are dry etched for forming the openings 29 and 31, the insulating films 61 and 27 are used as hard masks without using the photoresist pattern as an etching mask. For this reason, in such a state that the insulating films 23 and 25 formed of the low dielectric constant materials are exposed, the photoresist pattern is not removed (ashed). Accordingly, it is possible to prevent the low dielectric constant material films (the insulating films 23 and 25) from being changed in quality (damaged) at the time of ashing the photoresist pattern or the like. Thereby, it is possible to further improve the reliability of the semiconductor devices.

Furthermore, the second embodiment and the present embodiment may be used in combination.

Fourth Embodiment

FIGS. 33 to 42 show sectional views showing the principal portion of the semiconductor device in the manufacturing process according to another embodiment of the present invention. Since the manufacturing process of FIGS. 1 to 6 are the same as that in the first embodiment, the explanations thereof will be omitted and the manufacturing process following FIG. 6 will be explained hereinafter. Note that, also in FIGS. 33 to 42, the portions corresponding to the structure illustrated below the insulation film 11 in FIG. 1 will be omitted.

In the first to third embodiments, the wiring 34 (wiring 45) is formed using a so-called Dual-Damascene technique. In the present embodiment, the wiring 34 (wiring 45) is formed using a so-called Single-Damascene technique.

Figure 33:
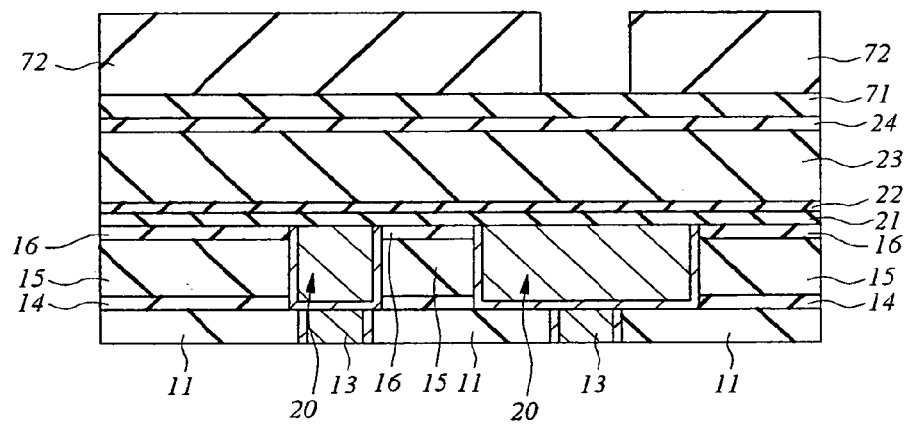
FIG. 33 is a sectional view showing the principal portion of a semiconductor device in a manufacturing process according to another embodiment of the present invention.

After the structure shown in FIG. 6 is obtained, as shown in FIG. 33, in the same manners as those in the first embodiment, the insulating films 23 and 24 are formed on the insulating film 22. Then, in the present embodiment, an insulating film (hard mask layer) 71 comprising, for example, a silicon nitride film (SiN), silicon carbide (SiC) film, silicon carbonitride (SiCN) film, aluminum oxide (AlO) film, or the like is formed on the insulating film 24. Then, a photoresist pattern 72 is formed on the insulating film 71 by using a photolithography method.

Figure 34:
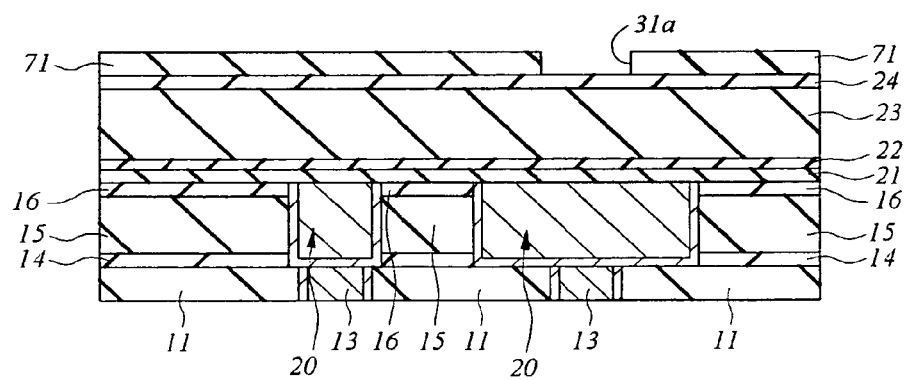
FIG. 34 is a sectional view showing the principal portion of the semiconductor device in the manufacturing process following FIG. 33.

Next, as shown in FIG. 34, by using the photoresist pattern 72 as an etching mask, the insulating film 71 is dry etched, and thereby an opening 31a is formed in the insulating film 71. Note that the opening 31a is formed in the area for forming a via, and corresponds to the opening 31 in the first embodiment. Thereafter, the photoresist pattern 72 is removed by the ashing or the like.

Figure 35:
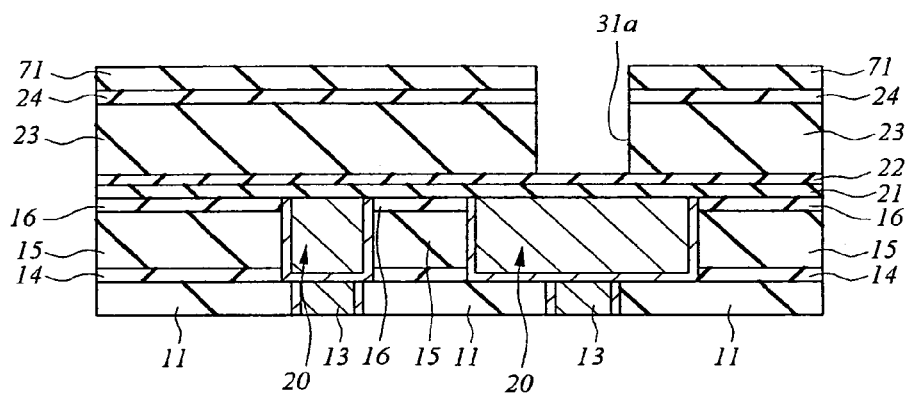
FIG. 35 is a sectional view showing the principal portion of the semiconductor device in the manufacturing process following FIG. 34.

Next, as shown in FIG. 35, by using the insulating film 71 as an etching mask (hard mask), the insulating films 24 and 23 are dry etched. Since a photoresist pattern is not used in dry etching the insulating film 23 made of a low dielectric constant material, it is possible to prevent the insulating film (low dielectric constant material film) 23 from being deteriorated in quality (damaged) due to the removing (ashing) of the photoresist pattern. Further, at the time of this dry etching, since the insulating film 22 (and the insulating film 21) is made to function as an etching stopper film, the insulating films 22 and 21 are left at the bottom of the opening 31a, whereby it is possible to prevent the wiring 20 from being etched.

Figure 36:
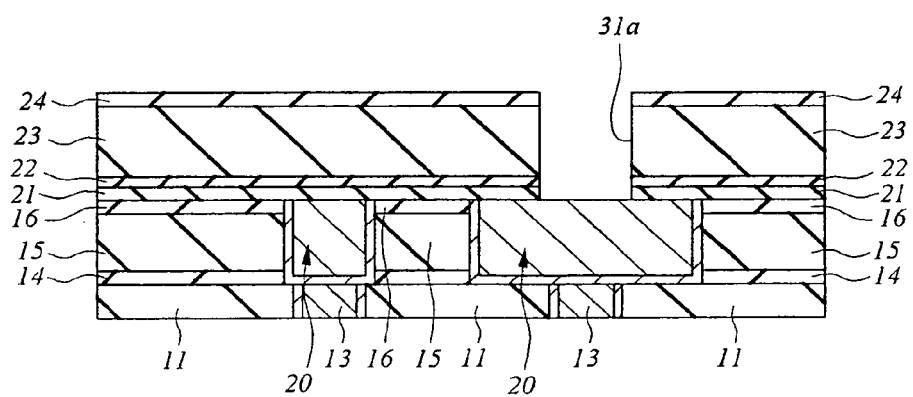
FIG. 36 is a sectional view showing the principal portion of the semiconductor device in the manufacturing process following FIG. 35.

Next, as shown in FIG. 36, at the bottom of the opening 31a, the insulating films 22 and 21 are removed by the dry etching. Thereby, the upper surface of the wiring 20 is exposed from the bottom of the opening 31a. And, the insulating film 71 is removed by the dry etching. The insulating film 71 may be removed by the same dry etching as that in the step of removing the insulating films 22 and 21 at the bottom of the opening 31a, or by another dry etching different therefrom. The insulating film 24 left after removing the insulating film 71 can function as a protective film in the CMP treatment and the like in the same manners as those of the insulating films 16 and 26 in the first embodiment, and can be formed by, for example, a silicon oxide (SiO) film.

Figure 37:
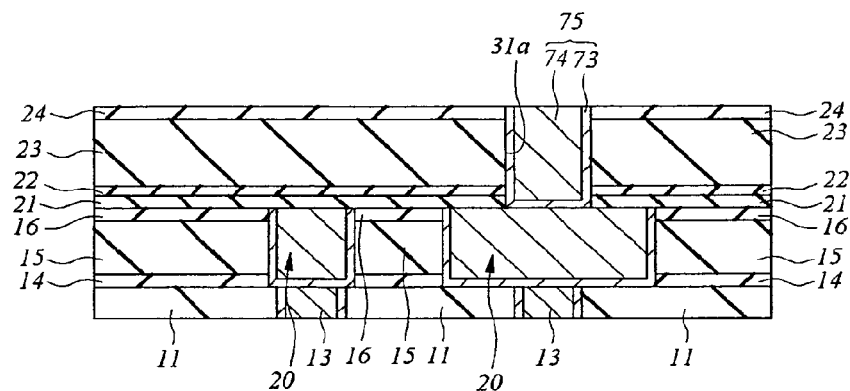
FIG. 37 is a sectional view showing the principal portion of the semiconductor device in the manufacturing process following FIG. 36.

Next, as shown in FIG. 37, similarly to the step of forming the wiring 20, a plug 75 comprising a conductive barrier film 73 and a copper main conductive film 74 are formed in the opening 31a. For example, on the entirety of the main surface of the semiconductor substrate 1 (on the insulating film 24 including the bottom and side walls of the opening 31a), a conductive barrier film 73 made of, for example, titanium nitride (TiN) and the like is formed; a main conductive film 74 made of copper (or copper alloy) is formed on the conductive barrier film 73 so as to fill (bury) the inside of the opening 31a therewith; and the main conductive film 74 and the conductive barrier film 73 are polished by, for example, the CMP method until the upper surface of the insulating film 24 is exposed. In this manner, the unnecessary conductive barrier film 73 and main conductive film 74 on the insulating film 24 are removed, and then the conductive barrier film 73 and the main conductive film 74 are left respectively in the opening 31a, whereby the plug 75 comprising the relatively thin conductive barrier film 73 and the relatively thick main conductive film 74 is formed. The formed plug 75 is electrically connected to the wiring 20.

Figure 38:
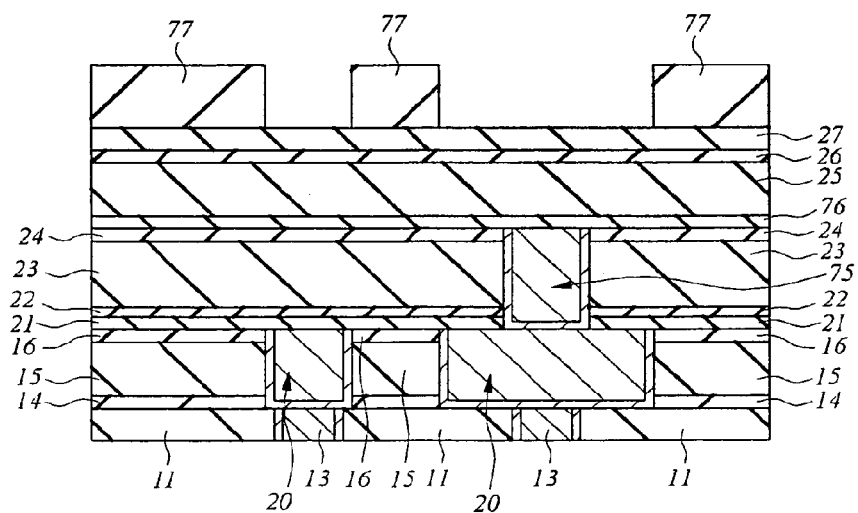
FIG. 38 is a sectional view showing the principal portion of the semiconductor device in the manufacturing process following FIG. 37.

Then, after the reducing plasma and/or the cleaning as occasion demands are performed, as shown in FIG. 38, on the entirety of the main surface of the semiconductor substrate 1 (on the insulating film 24 including the upper surface of the plug 75), an insulating film 76 including, for example, a silicon nitride film and the like is formed, and the insulating films 25, 26, and 27 are formed on the insulating film 76 similarly to the first embodiment. If unnecessary, the formation of the insulating film 76 may be omitted. And, a photoresist pattern 77 is formed on the insulating film 27 by the photolithography method.

Figure 39:
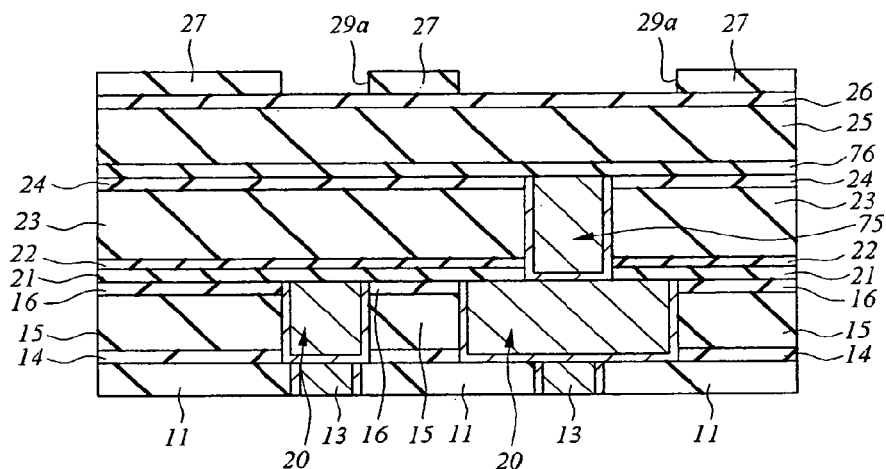
FIG. 39 is a sectional view showing the principal portion of the semiconductor device in the manufacturing process following FIG. 38.

Next, as shown in FIG. 39, by using the photoresist pattern 77 as an etching mask, the insulating film 27 is dry etched to form openings 29a in the insulating film 27. Note that the opening 29a is formed in the area for forming a wiring groove, and corresponds to the opening 29 in the first embodiment. Therefore, the plane area of the opening 29a includes that of the opening 31a. Then, the photoresist pattern 77 is removed by the ashing or the like.

Figure 40:
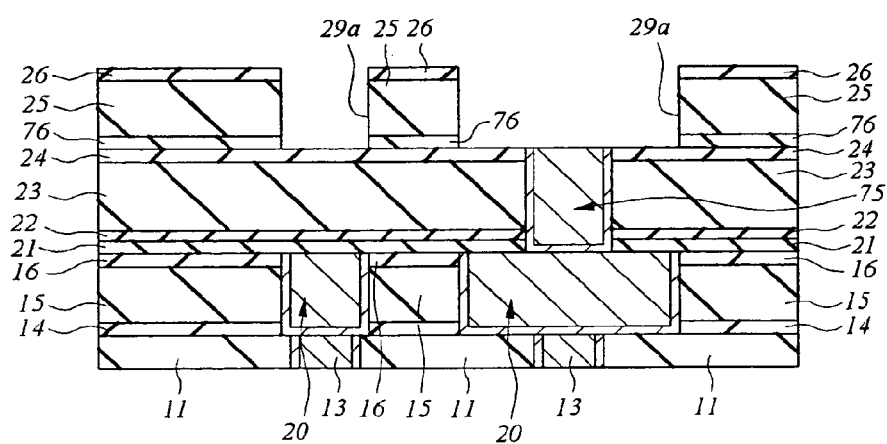
FIG. 40 is a sectional view showing the principal portion of the semiconductor device in the manufacturing process following FIG. 39.

Next, as shown in FIG. 40, by using the insulating film 27 as an etching mask (hard mask), the insulating films 26 and 25 are dry etched. When the insulating film 25 formed of the low dielectric constant material film is dry etched, no photoresist patter is used, whereby it is possible to prevent a deterioration in quality (damage) of the insulating film 25 (the low dielectric constant material film) caused due to the removing (ashing) of the photoresist pattern. Then, at the bottoms of the openings 29a, the insulating film 76 is removed by the dry etching. For this reason, from the bottoms of the openings 29a, the upper surfaces of the wirings 20 are exposed. Note that, if the formation of the insulating film 76 is omitted, the upper surfaces of the wirings 20 are exposed from the bottoms of the openings 29a by the dry etching of the above-mentioned insulating films 26 and 25. And, the insulating film 27 is removed by the dry etching. The insulating film 27 may be removed by the same dry etching as that in the step of removing the insulating film 76 at the bottom of the opening 29a, or by another dry etching different therefrom. The insulating film 26 left after the insulating film 27 is removed can function as a protective film in the CMP treatment or the like.

Figure 41:
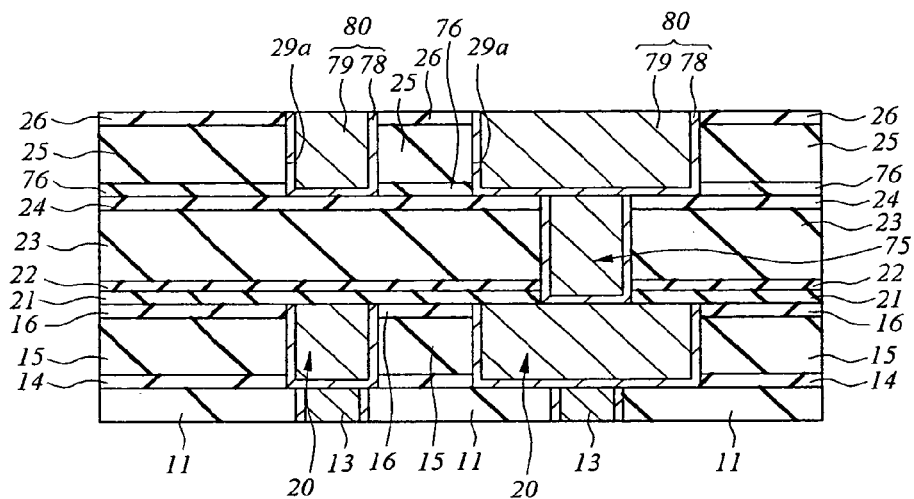
FIG. 41 is a sectional view showing the principal portion of the semiconductor device in the manufacturing process following FIG. 40.

Next, as shown in FIG. 41, similarly to the step of forming the wiring 20, a wiring (second layer wiring) 80 formed of a conductive barrier film 78 and a copper main conductive film 79 is formed in the opening 29a. For example, on the entirety of the main surface of the semiconductor substrate 1 (on the insulating film 26 including the bottom and side walls of the opening 29a), a conductive barrier film 78 made of, for example, titanium nitride (TiN) and the like is formed; a main conductive film 79 made of copper (or copper alloy) is formed on the conductive barrier film 78 so as to fill (bury) the inside of the opening 29a therewith; and the main conductive film 79 and the conductive barrier film 78 are polished by, for example, the CMP method until the upper surface of the insulating film 26 is exposed. In this manner, the unnecessary conductive barrier film 78 and main conductive film 79 on the insulating film 26 are removed and the conductive barrier film 78 and the main conductive film 79 are left in the opening 29a, whereby a wiring 80 comprising a relatively thin conductive barrier film 78 and a relatively thick main conductive film 79 is formed in the opening 29a. The formed wiring 80 is electrically connected to the wiring 20 via the plug 75.

Figure 42:
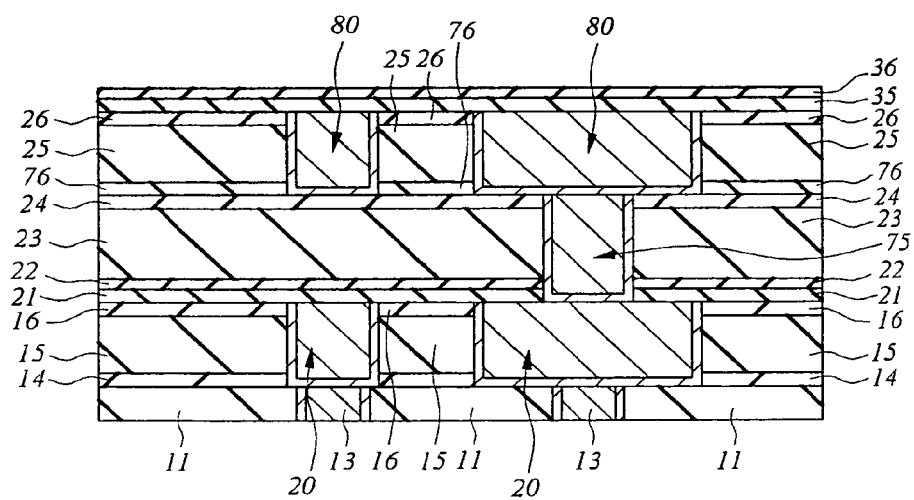
FIG. 42 is a sectional view showing the principal portion of the semiconductor device in the manufacturing process following FIG. 41.

Then, as shown in FIG. 42, the insulating films 35 and 36 as barrier insulating films are formed on the wirings 80, similarly to the first embodiment. Then, similarly to the step of forming the plug 75 and the wiring 80 in the present embodiment, further upper layer plug and wiring electrically connected to the wiring 80 are formed. However, the explanations thereof will be omitted here.

In the present embodiment, the same effects as those in the first embodiment can be attained. Further, in the present embodiment, when the insulating films 23 and 25 made of the low dielectric constant materials are dry etched for forming the openings 31a and 29a, the insulating films 71 and 27 are used as hard masks without using the photoresist pattern as an etching mask. Therefore, in such a state that the insulating films 23 and 25 made of the low dielectric constant materials are exposed, the photoresist pattern is not removed (ashed). Accordingly, it is possible to prevent the low dielectric constant material films (the insulating films 23 and 25) from being deteriorated in quality (or damaged) due to the ashing of the photoresist pattern or the like. This can further improve the reliability of the semiconductor devices.

Moreover, the second embodiment and the present embodiment may be used in combination.

Fifth Embodiment

FIGS. 43 to 46 show sectional views showing the principal portion of the semiconductor device in the manufacturing process according to another embodiment of the present invention. Since the manufacturing process of FIGS. 1 to 5 in this case is the same as that in the first embodiment, the explanations thereof will be omitted here and the manufacturing process following FIG. 5 will be explained hereinafter. Note that, also in FIGS. 43 to 46, the portions corresponding to the structure illustrated below the insulation film 11 in FIG. 1 will be omitted.

Figure 43:
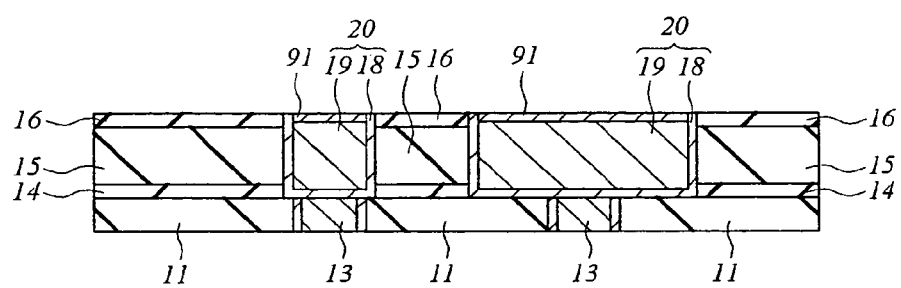
FIG. 43 is a sectional view showing the principal portion of a semiconductor device in a manufacturing process according to another embodiment of the present invention.

After the structure shown in FIG. 5 is obtained, as shown in FIG. 43, a film 91 (i.e., approximately 20 nm or less) is formed near the surface of the main conductive film 19 of the wiring 20. The film 91 is made of a copper (Cu) compound whose a diffusion coefficient is smaller than that of copper (Cu), or made of metal other than copper (Cu).

The film 91 may, for example, be formed as follows. After the structure shown in FIG. 5 is obtained, the ammonia ($NH_3$) plasma treatment or the like is performed to the semiconductor substrate 1 in such a state that the surface of the wiring 20 is exposed, and a copper nitride (CuN) film is formed on the surface of the wiring 20, and thereby the film 91 made of copper nitride (CuN) may be formed. At this time, it is further preferred that the cleaning treatment is performed on the surfaces of the wirings 20 (and the surface of the insulating film 16) and the surfaces of the wirings 20 are cleaned, and thereafter the film 91 made of copper nitride (CuN) is formed on the cleaned surfaces of the wirings 20.

Or, the film 91 may be formed as follows. The ammonia ($NH_3$) plasma treatment is performed to the semiconductor substrate 1 in such a state that the surface of the wiring 20 is exposed, and thereafter a mono silane gas or the like is sprayed thereon, and thereby a copper layer ($CuSi_x$ layer) containing (added by) a small quantity (e.g., approximately 1 to 2 atom %) of silicon (Si) is formed on the surface of the wiring 20 and the film 91 made of copper to which silicon is added may be formed. Further, also by using a copper layer ($CuAl_x$ layer) to which a small quantity of aluminum (Al) is added, the film 91 may be formed.

Or, the film 91 may be formed also by using a selective tungsten CVD method or the like. For example, after the structure shown in FIG. 5 is obtained, a tungsten film is selectively deposited on the surface of the wiring 20 exposed from the insulating film 16, by the CVD method using tungsten hexafluoride ($WF_6$) and a hydrogen ($H_2$) gas, and thereby the film 91 made of tungsten may be formed.

Or, the film 91 may be formed also by using a selective plating method or the like. For example, after the structure shown in FIG. 5 is obtained, a plating layer such as a Co film or a WB film is selectively formed on the surface of the wiring 20 exposed from the insulating film 16, and thereby the film 91 formed of a plating layer (e.g., Co or WB film) may be formed.

Figure 44:
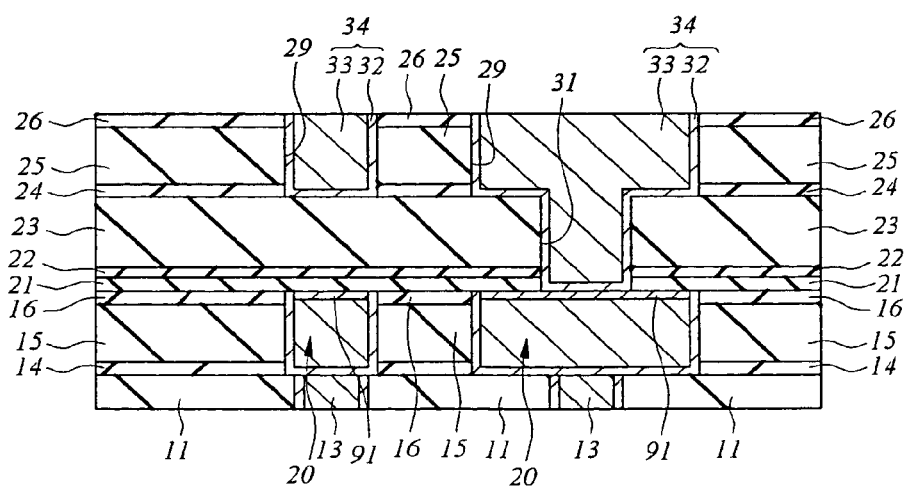
FIG. 44 is a sectional view showing the principal portion of the semiconductor device in the manufacturing process following FIG. 43.
Figure 45:
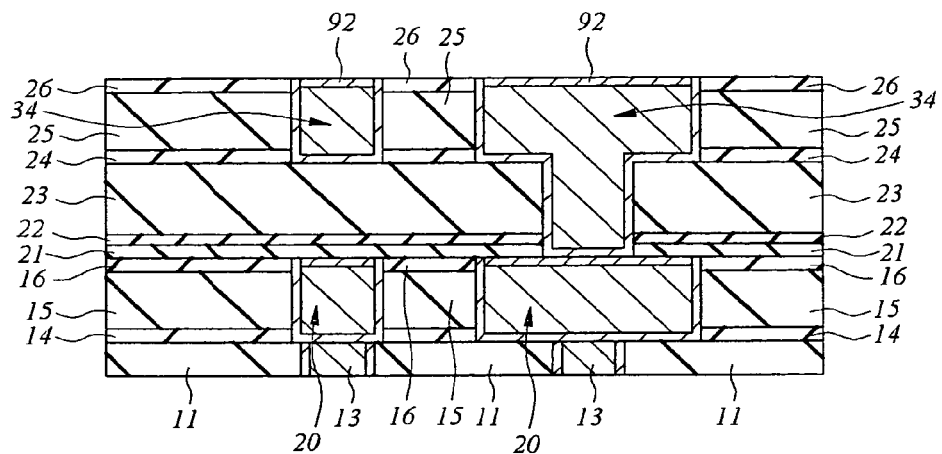
FIG. 45 is a sectional view showing the principal portion of the semiconductor device in the manufacturing process following FIG. 44.
Figure 46:
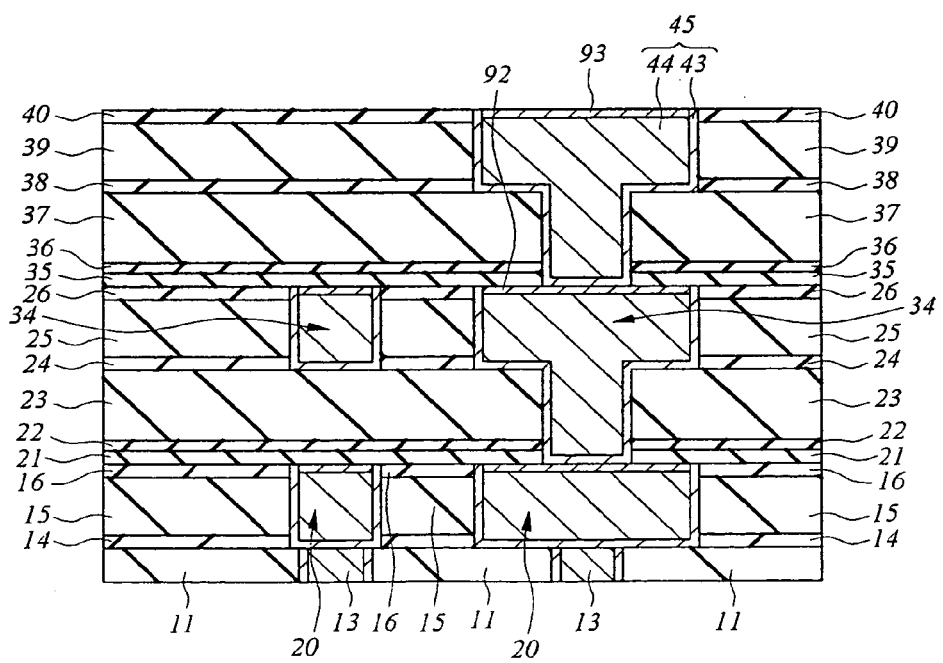
FIG. 46 is a sectional view showing the principal portion of the semiconductor device in the manufacturing process following FIG. 45.

After the film 91 is formed, the structure shown in FIG. 44 is obtained by performing the same process as that corresponding to FIGS. 6 to 13 in the first embodiment. Then, as shown in FIG. 45, near the surface (e.g., approximately 20 nm or less) of the main conductive film 33 of the wiring 34, a film 92 made of the same material as that of the film 91 is formed in the same manner. After the film 92 is formed, the structure of FIG. 46 can be formed by performing the same process as that corresponding to FIGS. 15 and 16 in the first embodiment, and the structure of FIG. 46 may be formed. However, in the present embodiment, also as for the wiring 45, a film 93 made of the same material as that of the film 91 is formed by the same manners near the surface of the main conductive film 44 of the wiring 45.

In the present embodiment, the film 91 is formed on the surface of the wiring 20, and the insulating film 21 as a barrier insulating film is formed on the film 91. Unless the film 91 is present, a film is made by a copper compound (or metal other than copper) whose diffusion coefficient is smaller than that of copper (Cu) and which arises from a bounding state of the interface between the copper film (main conductive film 19) and the barrier insulating film (insulating film 21), and then such a film is interposed between the copper film (main conductive film 19) and the barrier insulating film (insulating film 21). The wirings 34 and 45 are also formed in the same manner as described above. Therefore, it is possible to restrain the diffusion of copper in the interface between the wiring and the barrier insulating film, and further improve the stress migration characteristics of the wirings and the like.

Further, the first to fourth embodiments and the present embodiment may be used in combination.

Sixth Embodiment

Figure 47:
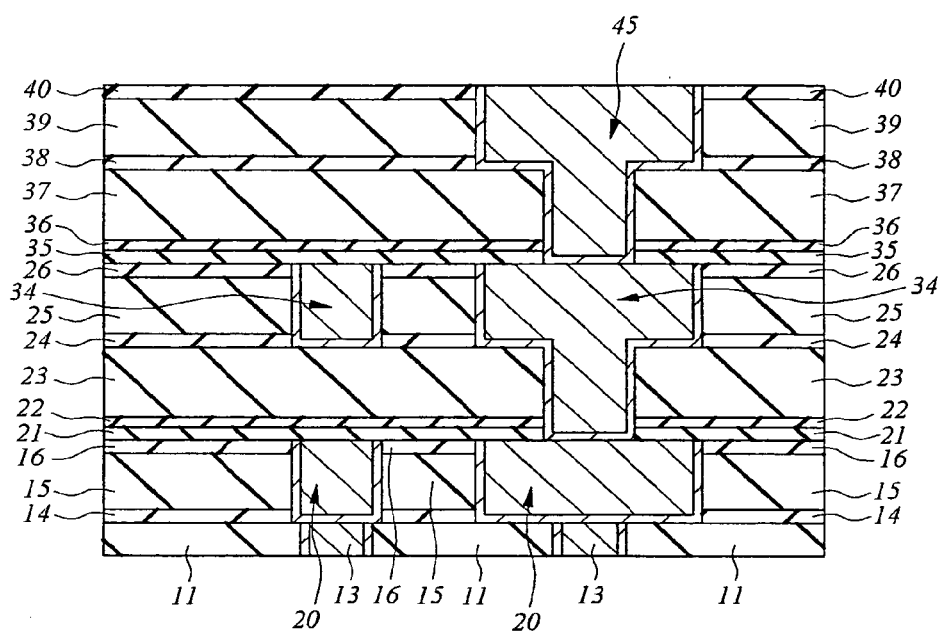
FIG. 47 is a sectional view showing the principal portion of a semiconductor device according to another embodiment of the present invention.

FIG. 47 shows a sectional view showing the principal portion of the semiconductor device in the manufacturing process according to another embodiment of the present invention. FIG. 47 corresponds to FIG. 16 in the first embodiment. Note that, also in FIG. 47, the portions corresponding to the structure illustrated below the insulation film 11 in FIG. 1 will be omitted.

The semiconductor device shown in FIG. 47 has the same structure as that in FIG. 16. In the present embodiment, a barrier insulating film of an embedded copper wiring (e.g., wiring 20) is constituted by a laminated film of a first barrier insulating film (e.g., insulating film 21) and a second barrier insulating film (e.g., insulating film 22), wherein the stress S1 of the laminated film is set at −180 MPa or more ($S_1 \geq -180$ MPa). Note that, in the present embodiment, if the stress (stress value) of a certain film is referred to, it means the stress (film stress) caused when such a film is formed directly on the semiconductor substrate 1 formed of a silicon substrate. Therefore, in the case where the stress of the laminated film of the first and second barrier insulating films is −180 Mpa or more, such stress corresponds to one caused in the laminated film at the time when the first and second barrier insulating films are formed directly on the semiconductor substrate 1. Further, when the stress $S_1$ of the laminated film is −180 MPa or more, such stress corresponds to one obtained by a combination of −180 MPa s $S_1 \leq 0$ and $0 \leq S_1$.

Figure 48:
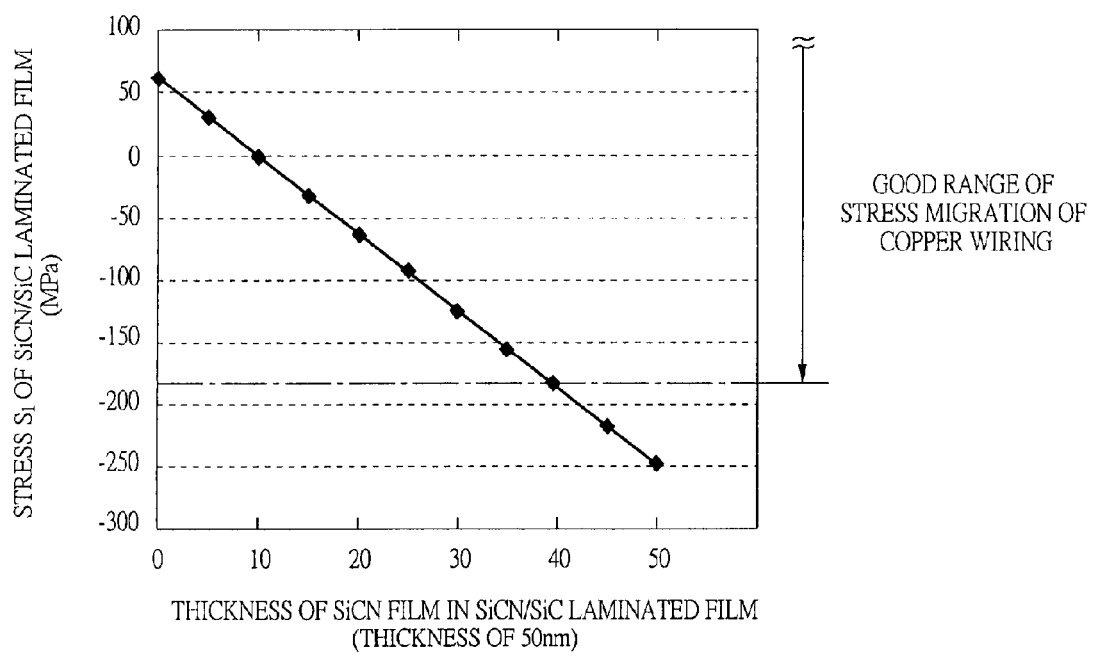
FIG. 48 is a graph showing a stress of a laminating film.

FIG. 48 is a graph showing the stress (stress value) S1 of a laminated film of the insulating films 21 and 22 at the time when the insulating film 21 is formed of a silicon carbonitride (SiCN) film and the insulating film 22 is formed of a silicon carbide (SiC) film and the entire thickness of the laminated film of the insulating films 21 and 22 is made (fixed) 50 nm and the ratio of each thickness of the insulating films 21 and 22 is changed. The horizontal axis of the graph in FIG. 48 corresponds to the thickness of the silicon carbonitride film (insulating film 21) at the time when the entire thickness of the laminated film of the silicon carbonitride film (insulating film 21) and the silicon carbide film (insulating film 22) is made (fixed) 50 nm. The vertical axis of the graph in FIG. 48 corresponds to the stress (stress value) $S_1$ of the laminated film.

As seen from FIG. 48, the stress of the single film of the silicon carbonitride (SiCN) film (corresponding to the case where the thickness of the silicon carbonitride (SiCN) film in the horizontal axis in FIG. 48 is 50 nm) has a negative value, and so compression stress occurs. Meanwhile, the stress of the single film of the silicon carbide (SiC) film (corresponding to the case where the thickness of the silicon carbonitride (SiCN) film in the horizontal axis in FIG. 48 is 0 nm) has a positive value, and therefore tensile stress occurs. In the single film of the silicon carbonitride (SiCN) film, relatively large negative stress occurs. However, as shown in FIG. 48, by decreasing the thickness of the silicon carbonitride (SiCN) film and increasing the ratio of the thickness of the silicon carbide (SiC) film, the stress of the entirety of the laminated film shifts to the positive-value direction.

According to the experiments by the present inventors, it has been found that when the thickness of the insulating film 21 becomes 40 nm or less and the stress of the laminated film of the insulating films 21 and 22 becomes −180 MPa or more, the preferable stress migration characteristics can be obtained. For example, if the laminated film whose stress becomes −180 MPa or more is used as the barrier insulating film disposed between the lower layer copper wiring and the interlayer insulating film (low dielectric constant material film), the results of the tests of being left to stand at 150° C. for 100 hours have indicated that the change ratio (rise ratio) of the electric resistance in the embedded copper wiring could be restrained within 2%. Meanwhile, if the laminated film whose stress is smaller than −180 MPa ($S_1 < -180$ MPa) is used as a laminated film disposed between the lower layer copper wiring and the interlayer insulating film (low dielectric constant material film), the results of the test of being left to stand at 150° C. for 100 hours have indicated that the change ratio (rise ratio) of the electric resistance of the embedded copper wiring exceeds 2% in some cases. If the laminated film is used as a barrier insulating film disposed between the lower layer copper wiring and the interlayer insulating film (low dielectric constant material film) and if the stress of the laminated film is −180 MPa or more, relaxation of the stress caused by being left to stand at the high temperature is difficult to make and it is possible to prevent the occurrence of problems arising from the stress migration.

In the present embodiment, the insulating film 21 whose barrier properties to copper are superior (to the insulating film 22) can be made to function as a barrier insulating film (copper diffusion prevention film) of the wiring 20, and the insulating film 22 can be made to function as a film for controlling the stress. For example, the insulating film 22 can function to relax the stress generated in the insulating film 22. In the single film of the insulating film 21 with excellent barrier properties to copper, even if the stress is not in a desirable range (wherein the stress is −180 MPa or more), then the insulating film 22 is formed on the insulating film 21 to control the stress of the entirety of the laminated film, for example, the negative stress (compression stress) that the insulating film 21 generates is relaxed by the positive stress (tensile stress) that the insulating film 22 generates, whereby the entire stress of the laminated film (barrier insulating films) can be controlled to be −180 MPa or more and the adhesiveness (adhesion properties) between the laminated film (barrier insulating film) and the interlayer insulating film (low dielectric constant material film) can be improved. Consequently, it is possible to restrain the problems arising from the stress migration (e.g., occurrence of the void between the upper surface of the lower layer embedded copper wiring and the via portion of the upper layer embedded copper wiring, which is caused by being left to stand at the high temperature, and the rising of the electric resistance of the embedded copper wiring, etc.) and to improve the reliability of the wirings. Therefore, the reliability of the semiconductor devices can be improved. Additionally, it is possible to reduce the manufacturing yields and the manufacturing costs of the semiconductor devices.

Further, the first to fifth embodiments and the present embodiment may be used in combination.

Seventh Embodiment

Figure 49:
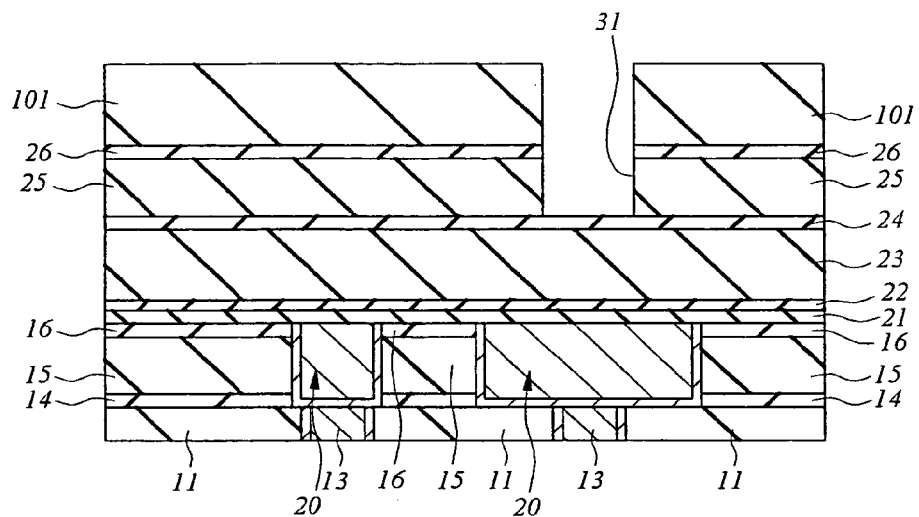
FIG. 49 is a sectional view showing the principal portion of a semiconductor device in a manufacturing process according to another embodiment of the present invention.
Figure 50:
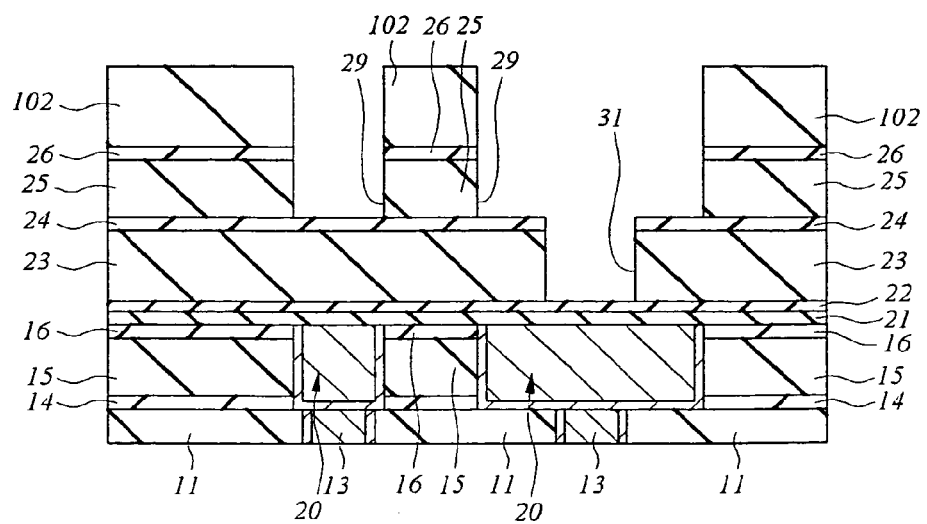
FIG. 50 is a sectional view showing the principal portion of the semiconductor device in the manufacturing process following FIG. 49
Figure 51:
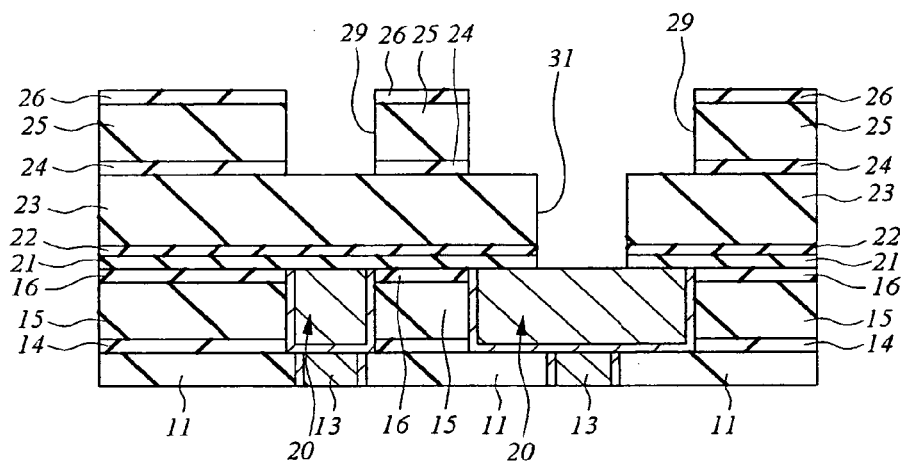
FIG. 51 is a sectional view showing the principal portion of the semiconductor device in the manufacturing process following FIG. 50.

FIGS. 49 to 51 show sectional views showing the principal portion of the semiconductor device in the case where another manufacturing process other than that in the first embodiment is used. Since the manufacturing process of FIGS. 1 to 6 is the same as that in the first embodiment, the explanations thereof will be omitted here and the manufacturing process following FIG. 6 will be explained hereinafter. Note that, also in FIGS. 49 to 51, the portions corresponding to the structure illustrated below the insulation film 11 in FIG. 1 will be omitted.

As shown in FIG. 49, the insulating film (interlayer insulating film) 23, the insulating film (etching stopper film) 24, the insulating film (interlayer insulating film) 25, and the insulating film (CMP protection film) 26 are formed on the insulating film 22 in this order, respectively. These insulating films 23 to 26 can be formed by using the same materials as those used in the first embodiment.

Next, a photoresist film is formed on the insulating film 26, and the photoresist film is exposed, developed, and patterned, and thereby a photoresist pattern 101 is formed. Then, by using the photoresist pattern 101 as an etching mask, the insulating films 26 and 25 are dry etched. Thereby, the opening 31 is formed in the insulating films 25 and 26. The opening 31 is formed in the area for forming a via. Therefore, the plane area of the opening 31 is included in that of the opening 29 as described hereinafter. Further, at the time of the dry etching, the insulating film 24 functions as an etching stopper film.

Next, after the photoresist pattern 101 is removed, as shown in FIG. 50, a photoresist film is formed on the insulating film 26 and the photoresist film is exposed, developed, and patterned, and thereby a photoresist pattern 102 is formed. Then, by using the photoresist pattern 102 as an etching mask, first, the insulating films 24 and 26 are dry etched. Thereafter, by dry etching the insulating film 25 and the insulating film 26 in the opening 31, the openings 31 and 29 can be formed in the insulating films 23 and 25, respectively. At the time of this dry etching, the insulating film 24 functions as an etching stopper film in the opening 29, and the insulating films 22 and 21 function as etching stopper films in the opening 31.

Next, as shown in FIG. 51, the insulating film 24 is removed by the dry etching at the bottom of the opening 29, and the insulating films 22 and 21 are removed by the dry etching at the bottom of the opening 31. Thereafter, the photoresist pattern 102 is removed. Thereby, the upper surface of the wiring 20 is exposed from the bottom of the opening 31. Note that the residual insulating film 26 can function as a protection film or the like in the CMP treatment to be performed later.

Next, the copper oxide, formed on the surface of the wiring 20 (lower layer copper wiring) exposed from the bottom of the opening 31, is removed, and a cleaning treatment of the exposed surface of the wiring 20 is performed. This cleaning treatment can be performed by the reducing plasma treatment such as a hydrogen ($H_2$) plasma treatment in which copper oxide (CuO, $Cu_2O$, $CuO_2$) on the surface of the copper wiring is reduced into copper (Cu).

The manufacturing process hereafter is made in the same manner as that following FIG. 13 in the first embodiment. Therefore, the wiring 34 can be formed by filling the openings 29 and 31, with the conductive barrier film 32 made of the same material as that of the conductive barrier film 18 and the main conductive film 33 made of the same material as that of the main conductive film 19.

As mentioned above, even when the manufacturing process as shown in the present embodiment is used for formation, it is possible to achieve, similarly to the first embodiment, both improvements of the barrier properties to copper between the copper wiring and the barrier insulating film (copper diffusion prevention) and of the adhesiveness between the barrier insulating film and the interlayer insulating film (low dielectric constant material film). Accordingly, the improvements of the TDDB life of the wirings and of the stress migration characteristics can be achieved. Thereby, the reliability of the wirings can be improved. Additionally, it is possible to reduce the manufacturing yields and the manufacturing costs of the semiconductor devices.

Further, the second, fifth, or sixth embodiment and the present embodiment may be used in combination.

Eighth Embodiment

FIGS. 52 to 55 show sectional views showing the principal portion of the semiconductor device in another manufacturing process in which a mask (photoresist pattern) is used in the seventh embodiment. Similarly to the seventh embodiment, since the manufacturing process of FIGS. 1 to 6 is the same as that in the first embodiment, the explanations thereof will be omitted here and the manufacturing process following FIG. 6 will be explained hereinafter. Note that, also in FIGS. 52 to 55, the portions corresponding to the structure illustrated below the insulation film 11 in FIG. 1 will be omitted.

Figure 52:
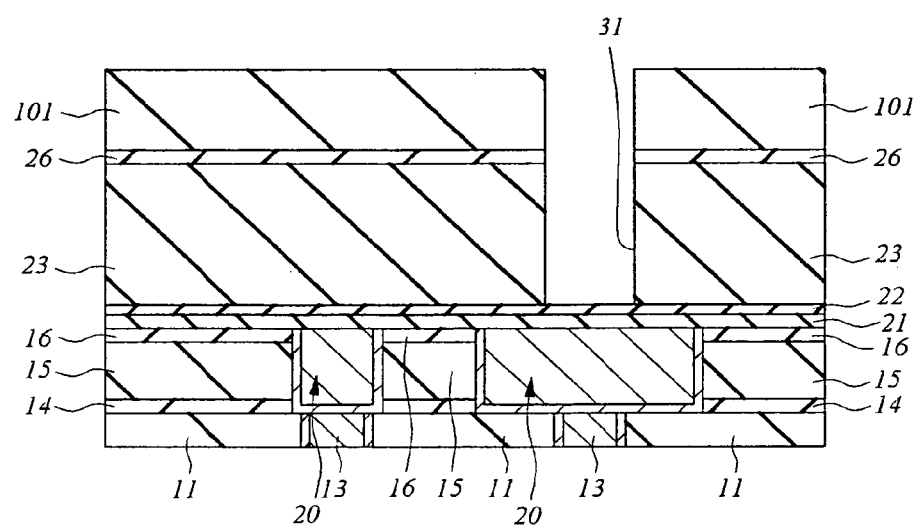
FIG. 52 is a sectional view showing the principal portion of a semiconductor device in a manufacturing process according to another embodiment of the present invention.

As shown in FIG. 52, on the insulating film 22, an insulating film (interlayer insulating film) 23 and an insulating film (CMP protective film) 26 are formed in this order. These insulating films 23 and 26 may be formed using the same materials as those used in the first embodiment. Further, the thickness of the insulating film 23 in the present embodiment is relatively thicker than that of the insulating film 23 in the first embodiment and, for example, substantially corresponds to the total thickness of the insulating films 23 and 25 (or the insulating films 23 to 25) in the first embodiment. In the present embodiment, the formation of the insulating film 24 is omitted. This is for achieving a reduction in the capacity between wirings, the capacity reduction being described later. Namely, the insulating film 23 is a low dielectric constant material film as shown in the first embodiment while the insulating film 24 is formed of a silicon oxide film and the like. For this reason, the insulating film 24 would have a higher dielectric constant than that of the insulating film 23. Accordingly, by omitting the forming of such a insulating film 24, the reduction in the capacity between the wirings can be achieved.

Next, a photoresist film is formed on the insulating film 26, and the photoresist film is exposed, developed and patterned, and thereby a photoresist pattern 101 is formed. Then, by using the photoresist pattern 101 as an etching mask, the insulating films 26 and 23 are dry etched. Thereby, the opening 31 going through (reaching to) the insulating film 22 is formed in the insulating films 26 and 23. At this time, by using an etching gas whose selectivity ratio is different from those of the insulating films 22 and 23, the insulating film 22 functions as an etching stopper, whereby the over etching to the wiring 20 can be prevented.

Figure 53:
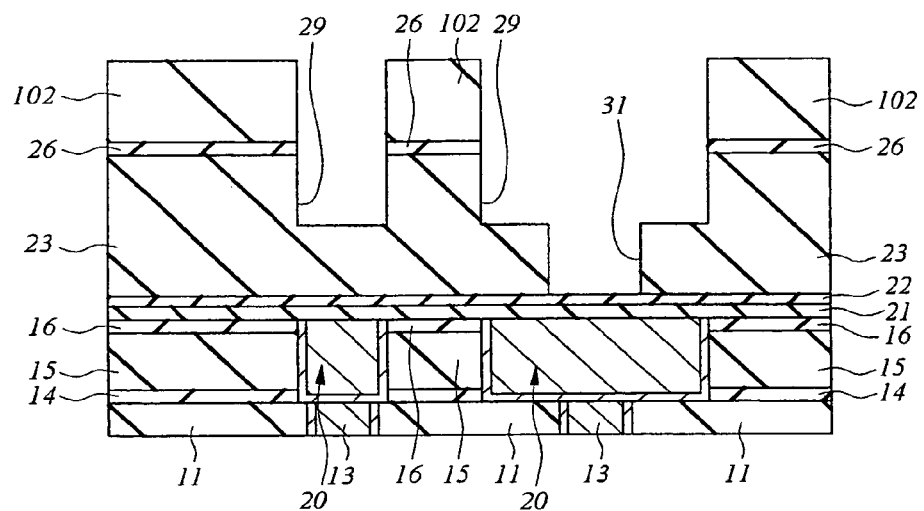
FIG. 53 is a sectional view showing the principal portion of the semiconductor device in the manufacturing process following FIG. 52.

Next, after the photoresist pattern 101 is removed, as shown in FIG. 53, a photoresist film is formed on the insulating film 26, and the photoresist film is exposed, developed, and patterned, and thereby a photoresist pattern 102 is formed. Then, by using the photoresist pattern 102 as an etching mask, the insulating films 26 and 23 are dry etched. By controlling the etching time so as to become shorter than the time for forming the above-mentioned opening 31, the opening 29 may be formed. Also at this time, the insulating film 22 functions as an etching stopper.

Figure 54:
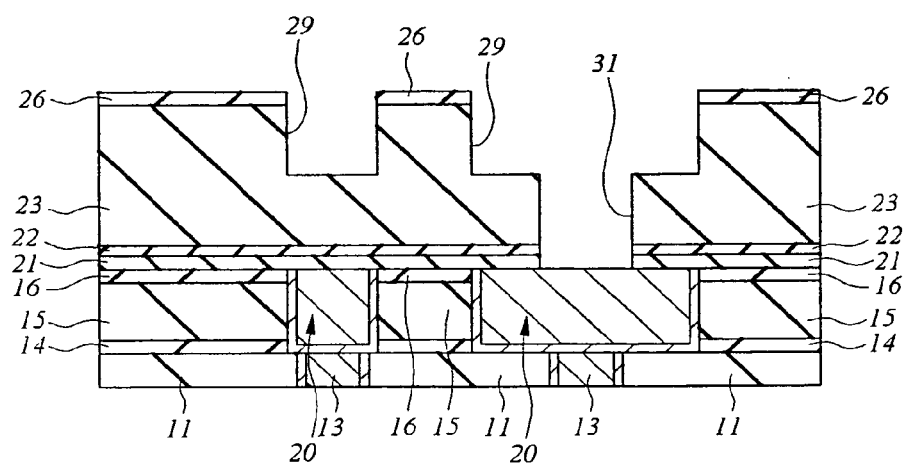
FIG. 54 is a sectional view showing the principal portion of the semiconductor device in the manufacturing process following FIG. 53.

Next, as shown in FIG. 54, the insulating films 22 and 21 are removed at the bottom of the opening 31 by the etching. Thereafter, the photoresist pattern 102 is removed. Thereby, from the bottom of the opening 31, the upper portion of the wiring 20 is exposed. Note that the insulating film 26 left thereon can function as a protective film in the CMP treatment and the like.

Next, the copper oxide, formed on the surface of the wiring 20 (lower layer copper wiring) exposed from the bottom of the opening 31, is removed and a cleaning treatment of the exposed surface of the wiring 20 is performed. This cleaning treatment may be performed by the reducing plasma treatment such as a hydrogen ($H_2$) plasma treatment in which copper oxide ($CuO$, $Cu_2O$, $CuO_2$) on the surface of the copper wiring is reduced into copper (Cu).

Figure 55:
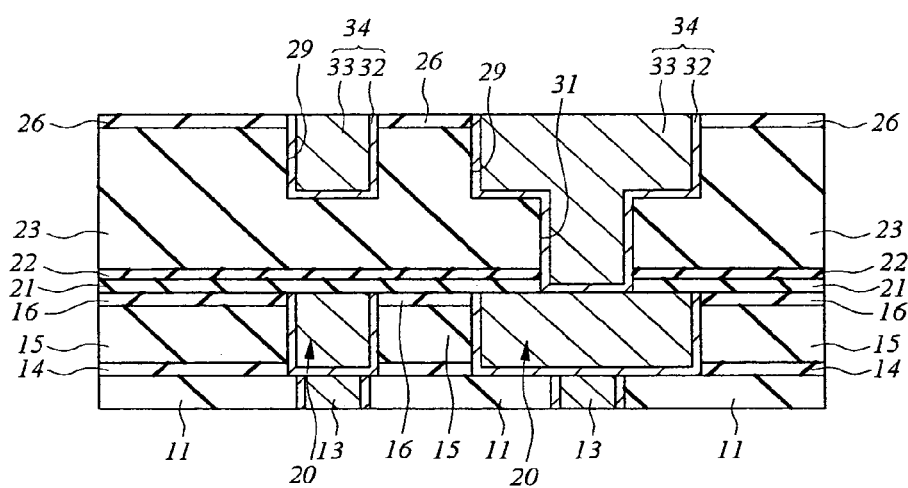
FIG. 55 is a sectional view showing the principal portion of the semiconductor device in the manufacturing process following FIG. 54.

The manufacturing process hereafter is the same as that subsequent to FIG. 13 in the first embodiment, and in the openings 29 and 31. The wiring 34 as shown in FIG. 55 may be formed by filling the openings 29 and 31, with the conductive barrier film 32 made of the same material as that of the conductive barrier film 18 and the main conductive film 33 made of the same material as that of the main conductive film 19.

Thus, in the present embodiment, the insulating film 24 whose dielectric constant is higher than that of the insulating film 23 is not formed and the formation of the opening 29 is made by controlling the time of the etching gas, whereby the capacity between the wirings can be reduced. Additionally, since the formation of the insulating film 24 can be omitted, a simplification of the manufacturing process can be achieved.

Moreover, even when the manufacturing process shown in the present embodiment is used for formation, it is possible to achieve, similarly to the first embodiment, both improvements of the barrier properties to copper between the copper wiring and the barrier insulating film (copper diffusion prevention) and of the adhesiveness between the barrier insulating film and the interlayer insulating film (low dielectric constant material film). For this reason, it is possible to improve the TDDB life of the wirings and the stress migration characteristics. Thereby, the reliability of the wirings can be improved. Additionally, the manufacturing yields and further the manufacturing costs of the semiconductor devices can be reduced.

And, at the time of forming the openings 29 and 31 in the present embodiment, the insulating films 27 and 61 may be used as masks as described in the third embodiment. In this case, the photoresist pattern is not removed (ashed) in such a state that the insulating film 23 made of the low dielectric constant material is exposed. Accordingly, it is possible to prevent change in quality of (damage to) the low dielectric constant material film (insulating film 23), which is caused by ashing or the like the photoresist pattern.

Further, the second, fifth, or sixth embodiment and the present embodiment may be used in combination.

In the foregoing, the inventions made by the inventors have been specifically described based on the embodiments thereof. However, needless to say, the present invention is not limited to the above-mentioned embodiments and can be variously modified and altered without departing from the gist thereof.

In the above-mentioned embodiments, the semiconductor device having an MISFET has been explained. However, the present invention is not limited to this, and may be applied to various semiconductor devices, each of which has wirings including main conductive films each containing copper as a primary component.

The effects obtained by representative ones among the inventions disclosed in this application will be briefly described as follows.

It is possible to improve the reliability of the copper wirings by using the laminated film of: the first barrier insulating film serving as a barrier insulating film of the embedded copper wiring, formed on the insulating film in which the copper wiring is embedded, and having excellent barrier properties to copper; and the second barrier insulating film formed on the first barrier insulating film, and having excellent adhesiveness to a low dielectric constant material. Further, by forming such first and second barrier insulating films on the surface of the copper wiring, the TDDB life can be improved.

Also, the concentration of nitrogen in the barrier insulating film near the interface between the copper wiring and the barrier insulating film is set higher than that of the barrier insulating film near the interface between the low dielectric constant material film of the upper layer barrier insulating film and the barrier insulating film, whereby the reliability of the copper wirings can be improved. Furthermore, by forming such barrier insulating film on the surface of the copper wiring, the TDDB life can be improved.

Additionally, a film is formed by a copper compound (or metal other than copper), whose diffusion coefficient is smaller than that of copper (Cu), and such a film is interposed between the copper film and the barrier insulating film. Therefore, it is possible to further restrain the diffusion of copper in the interface between the wiring and the barrier insulating film and improve the stress migration characteristics of the wiring and the like.

Furthermore, since the stress of the entirety of the laminated film (barrier insulating film) formed on the surface of the wiring is controlled so as to be −180 MPa or more, it is possible to restrain troubles arising from the stress migration.

The effects obtained by the representative ones among the inventions disclosed in this application will be briefly described as follows.

The reliability of the wirings, each of which includes the main conductive film containing copper as a primary component, can be improved.

Further, the reliability of the semiconductor devices can be improved.

What is claimed is:
1. A method for manufacturing a semiconductor integrated circuit device comprising steps of:
   (a) forming a first insulating film over a semiconductor substrate;
   (b) forming a first wiring trench in the first insulating film;
   (c) filling a first metal film in the first wiring trench;
   (d) forming a second insulating film over the first metal film and the first insulating film;
   (e) forming a third insulating film over the second insulating film;
   (f) forming a contact hole in the third and second insulating films;
   (g) forming a second wiring trench formed in the third insulating film; and
   (h) filling a second metal film in the second wiring trench and the contact hole as one combined unit, such that the second metal film is connected to the first metal film, wherein the first and second metal films include copper as a primary component, wherein each of the first and third insulating films has a greater thickness than the second insulating film, has a lower dielectric constant than a dielectric constant of a silicon oxide film and is comprised of a material including silicon, oxygen and carbon, wherein the second insulating film is formed of a different material from the third insulating films and is comprised of a material including silicon, nitrogen and carbon, and wherein a nitrogen concentration in the second insulating film disposed near the first metal film is larger than a nitrogen concentration in the second insulating film disposed near the third insulating film.

2. A method for manufacturing a semiconductor integrated circuit device according to claim 1, further comprising a step of:

(i) between the steps (b) and (c), forming a first conductive barrier film over a side surface and a bottom surface of the first wiring trench, wherein the first conductive barrier film is formed between the first metal film and the first insulating film and is formed of a different material form the first metal film.

3. A method for manufacturing a semiconductor integrated circuit device according to claim 2, further comprising a step of:

(j) between the steps (c) and (d), performing a plasma treatment to an upper surface of the first metal film.

4. A method for manufacturing a semiconductor integrated circuit device according to claim 3, further comprising a step of:

(k) between the steps (g) and (h), forming a second conductive barrier film over a side surface and a bottom surface of the second wiring trench and a side surface and a bottom surface of the contact hole, wherein the second conductive barrier film is formed between the second metal film and the third insulating film, between the second metal film and the first metal film, and is formed of a different material than the second metal film.

* * * * *